US012620973B2

(12) United States Patent
Kato et al.

(10) Patent No.: US 12,620,973 B2
(45) Date of Patent: May 5, 2026

(54) RADIO FREQUENCY MODULE AND COMMUNICATION DEVICE

(71) Applicant: Murata Manufacturing Co., Ltd., Kyoto (JP)

(72) Inventors: Masanori Kato, Kyoto (JP); Syunsuke Kido, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 317 days.

(21) Appl. No.: 18/474,693

(22) Filed: Sep. 26, 2023

(65) Prior Publication Data

US 2024/0022232 A1     Jan. 18, 2024

Related U.S. Application Data

(63) Continuation of application No. PCT/JP2022/014141, filed on Mar. 24, 2022.

(30) Foreign Application Priority Data

Mar. 31, 2021     (JP) ................................. 2021-061276

(51) Int. Cl.
H03H 9/25 (2006.01)
H03H 9/64 (2006.01)
H04B 1/40 (2015.01)

(52) U.S. Cl.
CPC ............ H03H 9/25 (2013.01); H03H 9/6483 (2013.01); H04B 1/40 (2013.01)

(58) Field of Classification Search
CPC ........... H03H 9/25; H03H 9/6483; H04B 1/40
See application file for complete search history.

(56) References Cited

U.S. PATENT DOCUMENTS

| | | | |
|---|---|---|---|
| 2005/0104685 A1 | 5/2005 | Kuroki et al. | |
| 2020/0028479 A1 | 1/2020 | Ta et al. | |
| 2020/0028481 A1 | 1/2020 | Sun et al. | |
| 2020/0204159 A1 | 6/2020 | Onodera et al. | |
| 2021/0091751 A1 | 3/2021 | Komatsu et al. | |

FOREIGN PATENT DOCUMENTS

| | | |
|---|---|---|
| JP | 2005-102098 A | 4/2005 |
| JP | 2016-225727 A | 12/2016 |
| JP | 2020-014204 A | 1/2020 |
| JP | 2020-014206 A | 1/2020 |
| JP | 2020-102758 A | 7/2020 |

OTHER PUBLICATIONS

International Search Report for PCT/JP2022/014141 dated Jun. 7, 2022.

*Primary Examiner* — Samuel S Outten
(74) *Attorney, Agent, or Firm* — McDonald Hopkins LLC

(57) ABSTRACT

Degradation of characteristics is to be reduced. A hybrid filter of a radio frequency module includes an acoustic wave filter and a first circuit. A plurality of circuit elements of the first circuit include a plurality of inductors and a plurality of capacitors. A second input/output portion of the acoustic wave filter includes a first connection terminal, a second connection terminal, and a conductor portion. A second circuit of the first circuit is connected between the first connection terminal and a ground terminal and includes at least one circuit element. A third circuit of the first circuit is connected between the second connection terminal and a second signal terminal and includes at least one inductor among the plurality of inductors and at least one capacitor among the plurality of capacitors.

18 Claims, 10 Drawing Sheets

RADIO FREQUENCY MODULE AND COMMUNICATION DEVICE

CROSS REFERENCE TO RELATED APPLICATION

This is a continuation of International Application No. PCT/JP2022/014141 filed on Mar. 24, 2022 which claims priority from Japanese Patent Application No. 2021-061276 filed on Mar. 31, 2021. The contents of these applications are incorporated herein by reference in their entireties.

BACKGROUND OF THE DISCLOSURE

Field of the Disclosure

The present disclosure generally relates to a radio frequency module and a communication device, and more specifically relates to a radio frequency module including a hybrid filter and a communication device including the radio frequency module.

Description of the Related Art

Patent Document 1 discloses a hybrid acoustic wave LC filter (hybrid filter) including an acoustic wave resonator and a plurality of circuit elements. The plurality of circuit elements include a plurality of inductors and a plurality of capacitors. The plurality of inductors and the plurality of capacitors are outside the die of the acoustic wave resonator.

Patent Document 1: Japanese Unexamined Patent Application Publication No. 2020-14204

BRIEF SUMMARY OF THE DISCLOSURE

In a radio frequency module including the hybrid acoustic wave filter disclosed in Patent Document 1, for example, the wiring length between an acoustic wave resonator and a circuit element (inductor or capacitor) is long, which may degrade the characteristics.

A possible benefit of the present disclosure is to provide a radio frequency module and a communication device that are capable of reducing the degradation of the characteristics.

A radio frequency module according to an aspect of the present disclosure includes a mounting substrate, a first signal terminal, a second signal terminal, a ground terminal, and a hybrid filter. The mounting substrate has a first main surface and a second main surface opposed to each other. The first signal terminal, the second signal terminal, and the ground terminal are disposed on the mounting substrate. The hybrid filter includes an acoustic wave filter and a first circuit. The acoustic wave filter includes at least one acoustic wave resonator, a first input/output portion connected to the first signal terminal, and a second input/output portion connected to the second signal terminal. The first circuit includes a plurality of circuit elements and is connected to the second input/output portion of the acoustic wave filter. The plurality of circuit elements include a plurality of inductors and a plurality of capacitors. The hybrid filter has a larger pass band width than the acoustic wave resonator. The second input/output portion of the acoustic wave filter includes a first connection terminal, a second connection terminal, and a conductor portion. The first connection terminal is connected to the mounting substrate. The second connection terminal is located apart from the first connection terminal in plan view in a thickness direction of the mounting substrate and is connected to the mounting substrate. The conductor portion connects the first connection terminal and the second connection terminal. The first circuit includes a second circuit and a third circuit. The second circuit is connected between the first connection terminal and the ground terminal. The second circuit includes at least one circuit element among the plurality of inductors and the plurality of capacitors. The third circuit is connected between the second connection terminal and the second signal terminal. The third circuit includes at least one inductor among the plurality of inductors and at least one capacitor among the plurality of capacitors.

A radio frequency module according to an aspect of the present disclosure includes a mounting substrate, a first signal terminal, a second signal terminal, a ground terminal, and a hybrid filter. The mounting substrate has a first main surface and a second main surface opposed to each other. The first signal terminal, the second signal terminal, and the ground terminal are disposed on the mounting substrate. The hybrid filter includes an acoustic wave filter and a first circuit. The acoustic wave filter includes at least one acoustic wave resonator, a first input/output portion connected to the first signal terminal, and a second input/output portion connected to the second signal terminal. The first circuit includes a plurality of circuit elements and is connected to the first input/output portion of the acoustic wave filter. The plurality of circuit elements include a plurality of inductors and a plurality of capacitors. The hybrid filter has a larger pass band width than the acoustic wave resonator. The first input/output portion of the acoustic wave filter includes a first connection terminal, a second connection terminal, and a conductor portion. The first connection terminal is connected to the mounting substrate. The second connection terminal is located apart from the first connection terminal in plan view in a thickness direction of the mounting substrate and is connected to the mounting substrate. The conductor portion connects the first connection terminal and the second connection terminal. The first circuit includes a second circuit and a third circuit. The second circuit is connected between the first connection terminal and the ground terminal. The second circuit includes at least one circuit element among the plurality of inductors and the plurality of capacitors. The third circuit is connected between the second connection terminal and the first signal terminal. The third circuit includes at least one inductor among the plurality of inductors and at least one capacitor among the plurality of capacitors.

A communication device according to an aspect of the present disclosure includes the radio frequency module and a signal processing circuit. The signal processing circuit performs signal processing on a radio frequency signal used in the radio frequency module.

The radio frequency module and the communication device according to the above aspects of the present disclosure are capable of reducing the degradation of the characteristics.

BRIEF DESCRIPTION OF THE SEVERAL VIEWS OF THE DRAWINGS

FIG. 2A is a plan view of the RF module. FIG. 2B is a plan view of a mounting substrate in the RF module.

FIG. 8 is a circuit diagram of an RF module according to a comparative example.

DETAILED DESCRIPTION OF THE DISCLOSURE

FIGS. 2A to 6, 9A, 9B, and 12A to 14 referred to in the following embodiments and so forth are schematic diagrams. The ratios of the sizes and thicknesses of the individual constituent elements in these figures do not necessarily reflect the actual dimensional ratios. In the following embodiments and so forth, "connected between A and B" means electrically connected to both A and B between A and B.

First Embodiment

Hereinafter, a radio frequency (RF) module 1 and a communication device 300 according to a first embodiment will be described with reference to FIGS. 1 to 7.

(1.1) Overview

Figure 1:
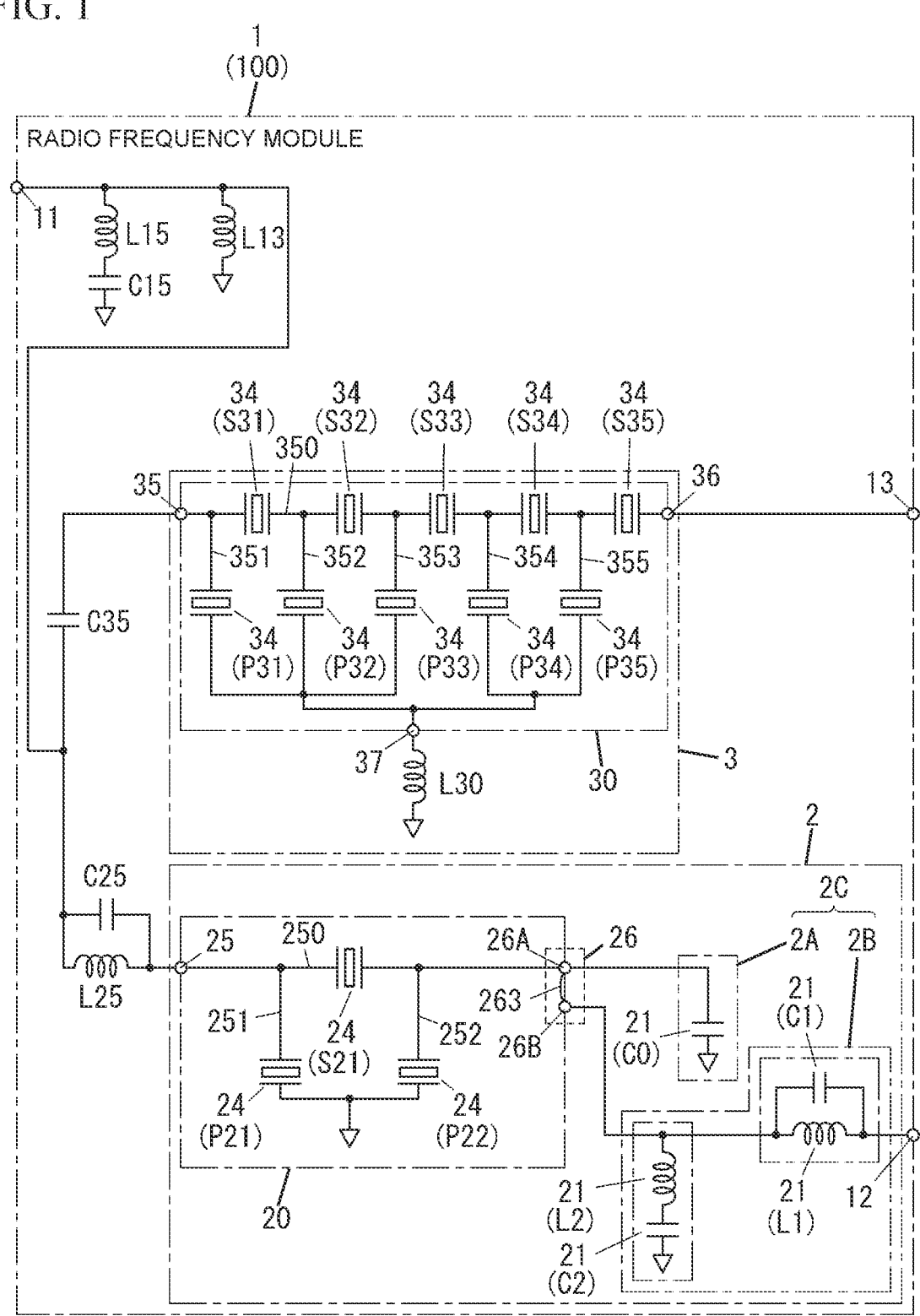
FIG. 1 is a circuit diagram of a radio frequency (RF) module according to a first embodiment.
Figures 2A, 2B:
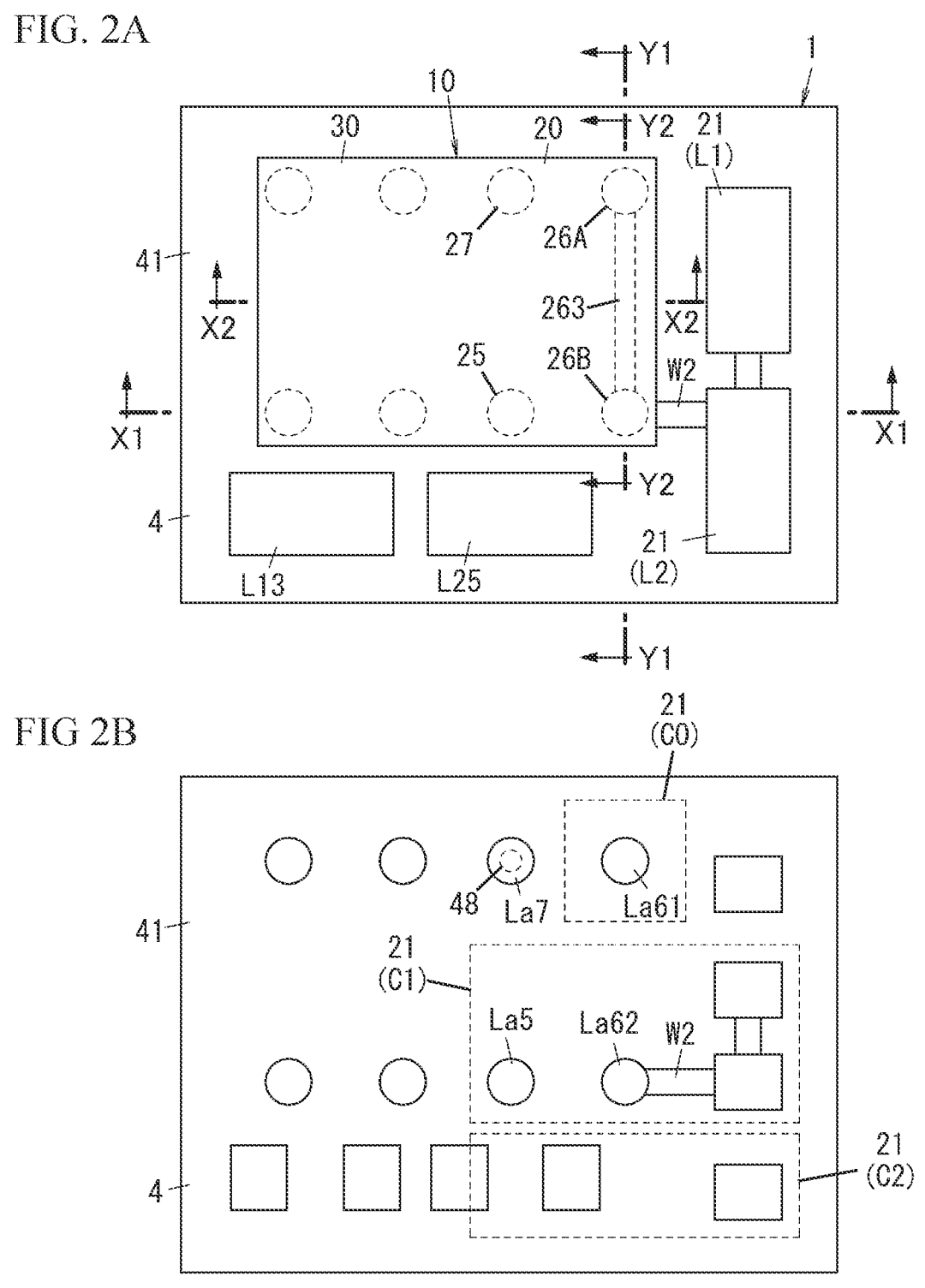
Figure 3:
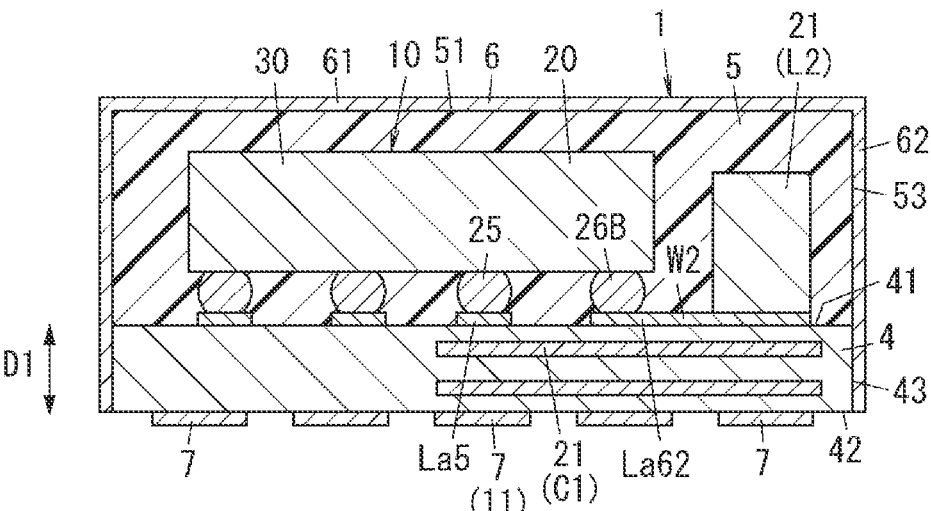
FIG. 3 is a sectional view of the RF module taken along line X1-X1 in FIG. 2A.
Figure 4:
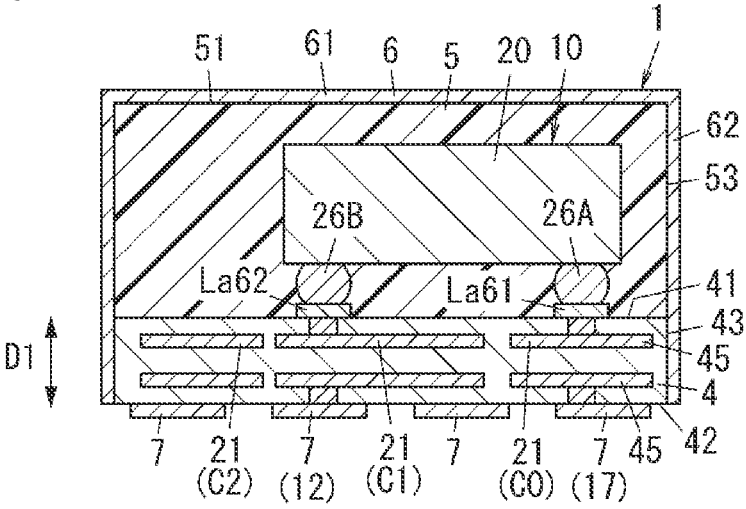
FIG. 4 is a sectional view of the RF module taken along line Y1-Y1 in FIG. 2A.

As illustrated in FIGS. 2A, 2B, 3, and 4, the RF module 1 according to the first embodiment includes a mounting substrate 4, a first signal terminal 11 (see FIG. 3), a second signal terminal 12 (see FIG. 4), a ground terminal 17 (see FIG. 4), and a hybrid filter 2 (see FIG. 1). The mounting substrate 4 has a first main surface 41 and a second main surface 42 opposed to each other (see FIG. 3). Here, "opposed" means opposed not physically but geometrically. The first signal terminal 11, the second signal terminal 12, and the ground terminal 17 are disposed on the mounting substrate 4. As illustrated in FIG. 1, the hybrid filter 2 includes an acoustic wave filter 20 (hereinafter also referred to as a first acoustic wave filter 20) and a first circuit 2C. The acoustic wave filter 20 includes at least one acoustic wave resonator 24 (for example, three acoustic wave resonators 24), a first input/output portion 25 connected to the first signal terminal 11, and a second input/output portion 26 connected to the second signal terminal 12. The first circuit 2C includes a plurality of circuit elements 21 and is connected to the second input/output portion 26 of the acoustic wave filter 20. The plurality of circuit elements 21 include a plurality of inductors L1 and L2 and a plurality of capacitors C0, C1, and C2. The hybrid filter 2 has a larger pass band width than the acoustic wave resonator 24. The pass band width of the acoustic wave resonator 24 is a band width ratio of the acoustic wave resonator 24, and is a difference between the anti-resonant frequency and the resonant frequency of the acoustic wave resonator 24. The second input/output portion 26 of the acoustic wave filter 20 includes a first connection terminal 26A, a second connection terminal 26B, and a conductor portion 263. The first connection terminal 26A is connected to the mounting substrate 4, as illustrated in FIGS. 2A and 4. The second connection terminal 26B is located apart from the first connection terminal 26A in plan view in a thickness direction D1 of the mounting substrate 4, and is connected to the mounting substrate 4, as illustrated in FIGS. 2A and 4. The conductor portion 263 connects the first connection terminal 26A and the second connection terminal 26B. As illustrated in FIG. 1, the first circuit 2C includes a second circuit 2A and a third circuit 2B. The second circuit 2A is connected between the first connection terminal 26A and the ground terminal 17 (see FIG. 4). The second circuit 2A includes one circuit element 21 (the capacitor C0) among the plurality of inductors L1 and L2 and the plurality of capacitors C0, C1, and C2. The third circuit 2B is connected between the second connection terminal 26B and the second signal terminal 12. The third circuit 2B includes the plurality of inductors L1 and L2, and two capacitors C1 and C2 among the plurality of capacitors C0, C1, and C2.

In the RF module 1, the hybrid filter 2 (hereinafter also referred to as a first filter 2) is connected between the first signal terminal 11 and the second signal terminal 12.

The RF module 1 further includes a third signal terminal 13 and a second filter 3. The third signal terminal 13 is disposed on the mounting substrate 4. The second filter 3 is connected between the first signal terminal 11 and the third signal terminal 13. The second filter 3 includes a second acoustic wave filter 30 and an inductor L30. The inductor L30 is disposed in the mounting substrate 4 and is connected between a ground electrode 37 of the second acoustic wave filter 30 and a ground terminal of the mounting substrate 4.

The RF module 1 constitutes a multiplexer 100 including the first filter 2 and the second filter 3.

The RF module 1 according to the first embodiment will be described in more detail after the circuit configurations of an RF circuit 200 including the RF module 1, and the communication device 300 have been described with reference to FIG. 7.

(1.2) RF Circuit Including RF Module, and Communication Device (1.2.1) Circuit Configurations of RF Circuit Including RF Module, and Communication Device The RF circuit 200 including the RF module 1 is used for the communication device 300, for example. The communication device 300 is, for example, a mobile phone (for example, a smartphone), but is not limited thereto and may be, for example, a wearable terminal (for example, a smart watch). The RF circuit 200 is, for example, a module conforming to the 4G (fourth generation mobile communication) standard, the 5G (fifth generation mobile communication) standard, or the like. The 4G standard is, for example, the 3GPP (Third Generation Partnership Project) LTE (Long Term Evolution) standard. The 5G standard is, for example, 5G NR (New Radio). The RF circuit 200 is, for example, a module capable of supporting carrier aggregation and dual connectivity.

The RF circuit 200 is configured to, for example, be capable of amplifying a transmission signal received from a signal processing circuit 301 and outputting the amplified transmission signal to an antenna 309. The RF circuit 200 is configured to be capable of amplifying a reception signal received from the antenna 309 and outputting the amplified reception signal to the signal processing circuit 301. The signal processing circuit 301 is not a constituent element of the RF circuit 200 but is a constituent element of the communication device 300 including the RF circuit 200. The RF circuit 200 is controlled by, for example, the signal processing circuit 301 included in the communication device 300. The communication device 300 includes the RF circuit 200 and the signal processing circuit 301. The communication device 300 further includes the antenna 309. The communication device 300 further includes a circuit board having the RF module 1 mounted thereon or therein. The circuit board is, for example, a printed wiring board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC), and performs signal processing on an RF signal. The RF signal processing circuit 302 performs, for example, signal processing such as up-conversion on an RF signal (transmission signal) outputted from the baseband signal processing circuit 303, and outputs the RF signal on which the signal processing has been performed. The RF signal processing circuit 302 performs, for example, signal processing such as down-conversion on an RF signal (reception signal) outputted from the RF circuit 200, and outputs the RF signal on which the signal processing has been performed to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like received from the outside. The baseband signal processing circuit 303 combines the I-phase signal and the Q-phase signal to perform IQ modulation processing, and outputs a transmission signal. At this time, the transmission signal is generated as a modulated signal (IQ signal), which is obtained through amplitude modulation performed on a carrier signal of a predetermined frequency in a period longer than the period of the carrier signal. The reception signal processed by the baseband signal processing circuit 303 is used as, for example, an image signal for displaying an image or an audio signal for a phone call of a user of the communication device 300. The RF circuit 200 transfers an RF signal (reception signal, transmission signal) between the antenna 309 and the RF signal processing circuit 302 of the signal processing circuit 301.

The RF circuit 200 includes the multiplexer 100, a plurality of (for example, two) transmission filters (a first transmission filter 111 and a second transmission filter 112), and a plurality of (for example, two) reception filters (a first reception filter 121 and a second reception filter 122). The RF circuit 200 also includes a first switch 8 and a second switch 9. The RF circuit 200 also includes a plurality of (for example, two) power amplifiers (a first power amplifier 151 and a second power amplifier 152) and a plurality of (for example, two) low-noise amplifiers (a first low-noise amplifier 161 and a second low-noise amplifier 162). The RF circuit 200 also includes a plurality of (for example, two) output matching circuits (a first output matching circuit 131 and a second output matching circuit 132) and a plurality of (for example, two) input matching circuits (a first input matching circuit 141 and a second input matching circuit 142).

The RF circuit 200 also includes a plurality of external connection terminals. The plurality of external connection terminals include an antenna terminal T0, a first signal input terminal T1, a second signal input terminal T2, a first signal output terminal T3, a second signal output terminal T4, and a plurality of external ground terminals. The plurality of external ground terminals are terminals which are electrically connected to the above-described ground electrode of the circuit board included in the communication device 300 and to which a ground potential is applied.

Hereinafter, the circuit configuration of the RF circuit 200 will be described in more detail.

As illustrated in FIG. 1, the multiplexer 100 includes the first filter 2 (hybrid filter 2), the second filter 3, the first signal terminal 11, the second signal terminal 12, and the third signal terminal 13. The first signal terminal 11 is a common terminal connected to the first filter 2 and the second filter 3, is connected to the second signal terminal 12 via the first filter 2, and is connected to the third signal terminal 13 via the second filter 3. The first signal terminal 11, the second signal terminal 12, and the third signal terminal 13 are each an input/output terminal used for the input and output of an RF signal. In the RF circuit 200 illustrated in FIG. 7, the first signal terminal 11 (see FIG. 1) of the multiplexer 100 is connected to the antenna terminal T0. The antenna terminal T0 is connected to the antenna 309. The first filter 2 has a pass band including, for example, 1710 MHz to 2370 MHz and 2496 MHz to 2690 MHz. The second filter 3 has a pass band including 2400 MHz to 2483 MHz. That is, the pass band of the second filter 3 includes the frequency band of the 2.4 GHz band of Wi-Fi (registered trademark).

The first transmission filter 111 has a pass band including the transmission band of a first communication band. The second transmission filter 112 has a pass band including the transmission band of a second communication band. The first communication band is, for example, Band 41 of the 3GPP LTE standard or n41 of the 5G NR standard. The second communication band is, for example, the 2.4 GHz band of Wi-Fi (registered trademark). The first transmission filter 111 is connectable to the first filter 2 of the multiplexer 100 via the first switch 8. The second transmission filter 112 is connectable to the second filter 3 of the multiplexer 100 via the second switch 9.

The first reception filter 121 has a pass band including the reception band of a third communication band. The third communication band is, for example, the same as the first communication band. The second reception filter 122 has a pass band including the reception band of a fourth communication band. The fourth communication band is, for example, the same as the second communication band. The first reception filter 121 is connectable to the first filter 2 of the multiplexer 100 via the first switch 8. The second reception filter 122 is connectable to the second filter 3 of the multiplexer 100 via the second switch 9.

The first switch 8 includes a common terminal 80 and a plurality of (for example, two) selection terminals 81 and 82. In the first switch 8, the common terminal 80 is connected to the first filter 2 of the multiplexer 100. More specifically, the common terminal 80 is connected to the second signal terminal 12 (see FIG. 1) of the RF module 1 constituting the multiplexer 100, and is connected to the first filter 2 via the second signal terminal 12. In the first switch 8, the selection terminal 81 is connected to the first transmission filter 111, and the selection terminal 82 is connected to the first reception filter 121. The first switch 8 is, for example, controlled by the signal processing circuit 301. In this case, the first switch 8 switches the connection state between the common terminal 80 and the plurality of selection terminals 81 and 82 in accordance with a control signal from the RF signal processing circuit 302 of the signal processing circuit 301. The first switch 8 is, for example, a switch integrated circuit (IC). The first switch 8 is, for example, a switch capable of connecting at least one of the plurality of selection terminals 81 and 82 to the common terminal 80. The first switch 8 is, for example, a switch capable of one-to-one connection and one-to-many connection.

The second switch 9 includes a common terminal 90 and a plurality of (for example, two) selection terminals 91 and 92. In the second switch 9, the common terminal 90 is connected to the second filter 3 of the multiplexer 100. More specifically, the common terminal 90 is connected to the third signal terminal 13 (see FIG. 1) of the RF module 1 constituting the multiplexer 100, and is connected to the second filter 3 via the third signal terminal 13. In the second switch 9, the selection terminal 91 is connected to the second transmission filter 112, and the selection terminal 92 is connected to the second reception filter 122. The second switch 9 is, for example, controlled by the signal processing circuit 301. In this case, the second switch 9 switches the connection state between the common terminal 90 and the plurality of selection terminals 91 and 92 in accordance with a control signal from the RF signal processing circuit 302 of the signal processing circuit 301. The second switch 9 is, for example, a switch IC. The second switch 9 is, for example, a switch capable of connecting at least one of the plurality of selection terminals 91 and 92 to the common terminal 90. The second switch 9 is, for example, a switch capable of one-to-one connection and one-to-many connection.

The first power amplifier 151 includes an input terminal and an output terminal. The first power amplifier 151 amplifies a transmission signal inputted to the input terminal of the first power amplifier 151 and outputs the amplified transmission signal from the output terminal of the first power amplifier 151. The input terminal of the first power amplifier 151 is connected to the first signal input terminal T1. The input terminal of the first power amplifier 151 is connected to the signal processing circuit 301 via the first signal input terminal T1. The first signal input terminal T1 is a terminal for inputting an RF signal (transmission signal) from an external circuit (for example, the signal processing circuit 301) to the RF circuit 200. The output terminal of the first power amplifier 151 is connected to the first transmission filter 111 via the first output matching circuit 131. The first power amplifier 151 is a power amplifier capable of amplifying an RF signal in the pass band of the first transmission filter 111. The first output matching circuit 131 is a circuit for achieving the impedance matching between the first power amplifier 151 and the first transmission filter 111, and includes, for example, a plurality of inductors and a plurality of capacitors.

The second power amplifier 152 includes an input terminal and an output terminal. The second power amplifier 152 amplifies a transmission signal inputted to the input terminal of the second power amplifier 152 and outputs the amplified transmission signal from the output terminal of the second power amplifier 152. The input terminal of the second power amplifier 152 is connected to the second signal input terminal T2. The input terminal of the second power amplifier 152 is connected to the signal processing circuit 301 via the second signal input terminal T2. The second signal input terminal T2 is a terminal for inputting an RF signal (transmission signal) from an external circuit (for example, the signal processing circuit 301) to the RF circuit 200. The output terminal of the second power amplifier 152 is connected to the second transmission filter 112 via the second output matching circuit 132. The second power amplifier 152 is a power amplifier capable of amplifying an RF signal in the pass band of the second transmission filter 112. The second output matching circuit 132 is a circuit for achieving the impedance matching between the second power amplifier 152 and the second transmission filter 112, and includes, for example, a plurality of inductors and a plurality of capacitors.

The RF circuit 200 may further include a controller. For example, the controller controls the first power amplifier 151 and the second power amplifier 152 in accordance with a control signal from the signal processing circuit 301.

The first low-noise amplifier 161 includes an input terminal and an output terminal. The first low-noise amplifier 161 amplifies a reception signal inputted to the input terminal of the first low-noise amplifier 161 and outputs the amplified reception signal from the output terminal of the first low-noise amplifier 161. The input terminal of the first low-noise amplifier 161 is connected to the first reception filter 121 via the first input matching circuit 141. The first input matching circuit 141 is a circuit for achieving the impedance matching between the first low-noise amplifier 161 and the first reception filter 121. The first input matching circuit 141 includes, for example, an inductor. The output terminal of the first low-noise amplifier 161 is connected to the first signal output terminal T3. The output terminal of the first low-noise amplifier 161 is connected to the signal processing circuit 301 via the first signal output terminal T3, for example. The first signal output terminal T3 is a terminal for outputting an RF signal (reception signal) from the first low-noise amplifier 161 to an external circuit (for example, the signal processing circuit 301).

The second low-noise amplifier 162 includes an input terminal and an output terminal. The second low-noise amplifier 162 amplifies a reception signal inputted to the input terminal of the second low-noise amplifier 162 and outputs the amplified reception signal from the output terminal of the second low-noise amplifier 162. The input terminal of the second low-noise amplifier 162 is connected to the second reception filter 122 via the second input matching circuit 142. The second input matching circuit 142 is a circuit for achieving the impedance matching between the second low-noise amplifier 162 and the second reception filter 122. The second input matching circuit 142 includes, for example, an inductor. The output terminal of the second low-noise amplifier 162 is connected to the signal processing circuit 301 via the second signal output terminal T4, for example. The second signal output terminal T4 is a terminal for outputting an RF signal (reception signal) from the second low-noise amplifier 162 to an external circuit (for example, the signal processing circuit 301).

(1.2.2) Circuit Configuration of RF Module

As illustrated in FIG. 1, the RF module 1 includes the first signal terminal 11, the second signal terminal 12, the third signal terminal 13, the hybrid filter 2 (first filter 2), and the second filter 3.

The hybrid filter 2 is connected between the first signal terminal 11 and the second signal terminal 12. The hybrid filter 2 includes the first acoustic wave filter 20 and the first circuit 2C. The first acoustic wave filter 20 includes at least one acoustic wave resonator 24 (for example, three acoustic wave resonators 24). The first acoustic wave filter 20 is, for example, a surface acoustic wave (SAW) filter using a surface acoustic wave. In this case, each of the plurality of acoustic wave resonators 24 is a SAW resonator.

The first acoustic wave filter 20 is a π-shaped filter. The first acoustic wave filter 20 includes three acoustic wave resonators 24, the first input/output portion 25 connected to the first signal terminal 11, the second input/output portion 26 connected to the second signal terminal 12, and a ground electrode 27 (see FIG. 2A). The three acoustic wave resonators 24 include one series arm resonator S21 and two parallel arm resonators P21 and P22. The second input/output portion 26 includes the first connection terminal 26A, the second connection terminal 26B, and the conductor portion 263 connecting the first connection terminal 26A and the second connection terminal 26B. The first connection terminal 26A and the second connection terminal 26B are connected by the conductor portion 263. The conductor portion 263 is a wiring portion for causing the first connection terminal 26A and the second connection terminal 26B to be at the same potential (equipotential).

The series arm resonator S21 is disposed on a path 250 (hereinafter also referred to as a series arm path 250) between the first input/output portion 25 and the second input/output portion 26. The series arm resonator S21 is connected between the first input/output portion 25 and the second input/output portion 26.

The parallel arm resonator P21 is disposed on a path 251 (parallel arm path 251). The path 251 is between the ground electrode 27 and a path between the first input/output portion 25 and the series arm resonator S21 in the series arm path 250. The parallel arm resonator P22 is disposed on a path 252 (parallel arm path 252). The path 252 is between the ground electrode 27 and a path between the series arm resonator S21 and the second input/output portion 26 in the series arm path 250.

The first circuit 2C includes the plurality of circuit elements 21. The first circuit 2C is connected between the second input/output portion 26 of the acoustic wave filter 20 and the second signal terminal 12. The first circuit 2C is an LC circuit (more specifically, an LC filter). The plurality of circuit elements 21 include the plurality of inductors L1 and L2 and the plurality of capacitors C0, C1, and C2. The first circuit 2C includes the second circuit 2A and the third circuit 2B.

The second circuit 2A is connected between the first connection terminal 26A of the first acoustic wave filter 20 and the ground terminal 17 (see FIG. 4) of the RF module 1. The second circuit 2A includes only the capacitor C0 (hereinafter also referred to as a first capacitor C0) among the plurality of inductors L1 and L2 and the plurality of capacitors C0, C1, and C2. The second circuit 2A is a shunt circuit including the capacitor C0 connected between the first connection terminal 26A of the first acoustic wave filter 20 and the ground terminal 17 (hereinafter also referred to as a first ground terminal 17) of the RF module 1.

The third circuit 2B is connected to the second connection terminal 26B. The third circuit 2B includes all the plurality of circuit elements 21 except the circuit element 21 included in the second circuit 2A (the capacitor C0). In the RF module 1 according to the first embodiment, the third circuit 2B includes two inductors L1 and L2 and two capacitors C1 and C2. Hereinafter, for convenience of description, the inductor L1 may be referred to as a first inductor L1, and the inductor L2 may be referred to as a second inductor L2. Hereinafter, for convenience of description, the capacitor C1 may be referred to as a second capacitor C1, and the capacitor C2 may be referred to as a third capacitor C2.

The first inductor L1 is connected in series to the first acoustic wave filter 20. More specifically, the first inductor L1 is connected between the second connection terminal 26B of the first acoustic wave filter 20 and the second signal terminal 12. The first inductor L1 has one end connected to the second connection terminal 26B of the first acoustic wave filter 20, and has the other end connected to the second signal terminal 12. Accordingly, the first inductor L1 is connected in series to the series arm resonator S21 of the first acoustic wave filter 20. The second capacitor C1 is connected in parallel to the first inductor L1. In the third circuit 2B, a series circuit composed of the second inductor L2 and the third capacitor C2 is connected between a ground terminal of the RF module 1 (hereinafter also referred to as a second ground terminal) and a path between the second connection terminal 26B of the first acoustic wave filter 20 and the first inductor L1. The series circuit composed of the second inductor L2 and the third capacitor C2 is a shunt circuit connected between the second connection terminal 26B of the first acoustic wave filter 20 and the second ground terminal of the RF module 1. The second ground terminal may be identical to the first ground terminal 17, or may be a ground terminal different from the first ground terminal 17. The hybrid filter 2 is a filter including the first acoustic wave filter 20 and an LC filter (the first circuit 2C). The hybrid filter 2 has a pass band width larger than that in a case where the hybrid filter 2 is constituted only by the first acoustic wave filter 20. The hybrid filter 2 has improved attenuation characteristics near the pass band as compared with a case where the hybrid filter 2 is constituted only by the LC filter. The hybrid filter 2 has a pass band width that is a frequency range in which the insertion loss is 3 dB or less in the filter characteristics. As described above, the hybrid filter 2 has a larger pass band width than the acoustic wave resonator 24. The pass band width of the acoustic wave resonator 24 is a band width ratio of the acoustic wave resonator 24, and is a difference between the anti-resonant frequency and the resonant frequency of the acoustic wave resonator 24.

The second filter 3 is connected between the first signal terminal 11 and the third signal terminal 13. The second filter 3 includes the second acoustic wave filter 30 and the inductor L30. The second acoustic wave filter 30 includes at least one acoustic wave resonator 34 (for example, ten acoustic wave resonators 34). The second acoustic wave filter 30 is, for example, a SAW filter using a surface acoustic wave. In this case, the plurality of acoustic wave resonators 34 are each a SAW resonator.

The second acoustic wave filter 30 is a ladder filter. The second acoustic wave filter 30 includes ten acoustic wave resonators 34, a first input/output portion 35 connected to the first signal terminal 11, a second input/output portion 36 connected to the third signal terminal 13, and the ground electrode 37. The ten acoustic wave resonators 34 include five series arm resonators S31, S32, S33, S34, and S35 and five parallel arm resonators P31, P32, P33, P34, and P35.

The five series arm resonators S31, S32, S33, S34, and S35 are disposed on a path 350 (hereinafter also referred to as a series arm path 350) between the first input/output portion 35 and the second input/output portion 36. The five series arm resonators S31, S32, S33, S34, and S35 are connected in series to each other on the series arm path 350. In the second acoustic wave filter 30, on the series arm path 350, the five series arm resonators S31, S32, S33, S34, and S35 are arranged in this order from the first input/output portion 35 side.

The parallel arm resonator P31 is disposed on a path 351 (parallel arm path 351). The path 351 is between the ground electrode 37 and a path between the first input/output portion 35 and the series arm resonator S31 in the series arm path 350. The parallel arm resonator P32 is disposed on a path 352 (parallel arm path 352). The path 352 is between the ground electrode 37 and a path between the series arm resonator S31 and the series arm resonator S32 in the series arm path 350. The parallel arm resonator P33 is disposed on a path 353 (parallel arm path 353). The path 353 is between the ground electrode 37 and a path between the series arm resonator S32 and the series arm resonator S33 in the series arm path 350. The parallel arm resonator P34 is disposed on a path 354 (parallel arm path 354). The path 354 is between the ground electrode 37 and a path between the series arm resonator S33 and the series arm resonator S34 in the series arm path 350. The parallel arm resonator P35 is disposed on a path 355 (parallel arm path 355). The path 355 is between the ground electrode 37 and a path between the series arm resonator S34 and the series arm resonator S35 in the series arm path 350.

The inductor L30 has one end connected to the ground electrode 37 of the second acoustic wave filter 30, and has the other end connected to the ground (ground terminal) of the RF module 1.

The RF module 1 further includes an inductor L15, a capacitor C15, and an inductor L13. A series circuit composed of the inductor L15 and the capacitor C15 is connected between a ground and a signal path between the first signal terminal 11 and a connection point between the first filter 2 and the second filter 3. The series circuit composed of the inductor L15 and the capacitor C15 has a function of attenuating harmonics in the pass band of the first filter 2 and harmonics in the pass band of the second filter 3. The inductor L13 is connected between a ground and the signal path between the first signal terminal 11 and the connection point between the first filter 2 and the second filter 3. The inductor L13 is provided as a countermeasure against electro-static discharge (ESD).

The RF module 1 further includes a first phase-shift circuit connected between the first signal terminal 11 and the first filter 2, and a second phase circuit connected between the first signal terminal and the second filter 3. The first phase-shift circuit is a parallel circuit composed of an inductor L25 and a capacitor C25. The second phase-shift circuit includes a capacitor C35.

(1.2.3) Structure of RF Module

Hereinafter, the structure of the RF module 1 will be described with reference to FIGS. 2A, 2B, and 3 to 6.

As illustrated in FIG. 2A, the RF module 1 includes the mounting substrate 4, the first signal terminal 11 (see FIG. 3), the second signal terminal 12 (see FIG. 1), the ground terminal 17 (see FIG. 4), the first acoustic wave filter 20, the first capacitor C0 (see FIGS. 2B and 4), the second capacitor C1 (see FIGS. 2B, 3, and 4), the third capacitor C2 (see FIGS. 2B and 4), the first inductor L1, and the second inductor L2. The RF module 1 further includes the third signal terminal 13 (see FIG. 1), the second acoustic wave filter 30, and the inductor L30 (see FIG. 1). The RF module 1 further includes the inductor L15 (see FIG. 1), the capacitor C15 (see FIG. 1), the inductor L13, the inductor L25, the capacitor C25 (see FIG. 1), and the capacitor C35 (see FIG. 1). The RF module 1 further includes a resin layer 5 (see FIGS. 3 and 4). The RF module 1 further includes a metal electrode layer 6 (see FIGS. 3 and 4).

As illustrated in FIGS. 3 and 4, the mounting substrate 4 has the first main surface 41 and the second main surface 42 opposed to each other in the thickness direction D1 of the mounting substrate 4. The mounting substrate 4 is, for example, a multilayer substrate including a plurality of dielectric layers and a plurality of conductive layers. The plurality of dielectric layers and the plurality of conductive layers are laminated in the thickness direction D1 of the mounting substrate 4. The plurality of conductive layers are formed in a certain pattern determined for each layer. The plurality of conductive layers each include one or more conductor portions in one plane orthogonal to the thickness direction D1 of the mounting substrate 4. The material of each conductive layer is, for example, copper. The plurality of conductive layers include a ground layer. In the RF module 1, the ground terminal 17 and the ground layer are electrically connected to each other via a via-conductor or the like included in the mounting substrate 4. The mounting substrate 4 is, for example, a low temperature co-fired ceramics (LTCC) substrate. The mounting substrate 4 is not limited to an LTCC substrate and may be, for example, a printed wiring board, a high temperature co-fired ceramics (HTCC) substrate, or a resin multilayer substrate. The mounting substrate 4 has an outer edge that forms a quadrangular shape in plan view in the thickness direction D1 of the mounting substrate 4.

The mounting substrate 4 is not limited to an LTCC substrate and may be, for example, a wiring structure. The wiring structure is, for example, a multilayer structure. The multilayer structure includes at least one insulating layer and at least one conductive layer. The insulating layer is formed in a certain pattern. In a case where there are a plurality of insulating layers, the plurality of insulating layers are formed in a certain pattern determined for each layer. The conductive layer is formed in a certain pattern different from the certain pattern of the insulating layer. In a case where there are a plurality of conductive layers, the plurality of conductive layers are formed in a certain pattern determined for each layer. The conductive layer may include one or more rewiring portions. In the wiring structure, of the two surfaces opposed to each other in the thickness direction of the multilayer structure, a first surface is the first main surface 41 of the mounting substrate 4, and a second surface is the second main surface 42 of the mounting substrate 4. The wiring structure may be, for example, an interposer. The interposer may be an interposer using a silicon substrate, or may be a substrate formed of multiple layers.

The first main surface 41 and the second main surface 42 of the mounting substrate 4 are apart from each other in the thickness direction D1 of the mounting substrate 4, and intersect the thickness direction D1 of the mounting substrate 4. The first main surface 41 of the mounting substrate 4 is, for example, orthogonal to the thickness direction D1 of the mounting substrate 4, but may include, for example, a side surface or the like of a conductor portion as a surface that is not orthogonal to the thickness direction D1. The second main surface 42 of the mounting substrate 4 is, for example, orthogonal to the thickness direction D1 of the mounting substrate 4, but may include, for example, a side surface or the like of a conductor portion as a surface that is not orthogonal to the thickness direction D1. The first main surface 41 and the second main surface 42 of the mounting substrate 4 may have fine irregularities, recessed portions, or protruding portions.

A plurality of external connection terminals 7 (see FIGS. 3 and 4) included in the RF module 1 are disposed on the second main surface 42 of the mounting substrate 4. "An external connection terminal 7 is disposed on the second main surface 42 of the mounting substrate 4" includes that the external connection terminal 7 is mechanically connected to the second main surface 42 of the mounting substrate 4 and that the external connection terminal 7 is electrically connected to (an appropriate conductor portion of) the mounting substrate 4. The plurality of external connection terminals 7 include the first signal terminal 11, the second signal terminal 12, the third signal terminal 13, the first ground terminal 17, and the second ground terminal. The first ground terminal 17 and the second ground terminal are electrically connected to the ground layer of the mounting substrate 4. The ground layer is a circuit ground of the RF module 1. In plan view in the thickness direction D1 of the mounting substrate 4, the plurality of external connection terminals 7 each have a quadrangular shape, but the shape is not limited thereto and may be, for example, a circular shape. The plurality of external connection terminals 7 each have a thickness less than the thickness of the mounting substrate 4. The material of the plurality of external connection terminals 7 is, for example, metal (for example, copper, copper alloy, or the like).

In the RF module 1, an electronic component 10 including the first acoustic wave filter 20 and the second acoustic wave filter 30 is mounted on the first main surface 41 of the mounting substrate 4. "The electronic component 10 is mounted on the first main surface 41 of the mounting substrate 4" includes that the electronic component 10 is disposed on (is mechanically connected to) the first main surface 41 of the mounting substrate 4 and that the electronic component 10 is electrically connected to (an appropriate conductor portion of) the mounting substrate 4. In the RF module 1 according to the first embodiment, the first input/output portion 25, the first connection terminal 26A, the second connection terminal 26B, and the ground electrode 27 of the first acoustic wave filter 20 are connected to the mounting substrate 4. The first input/output portion 25, the first connection terminal 26A, the second connection terminal 26B, and the ground electrode 27 of the first acoustic wave filter 20 each include a conductive bump. The material of the conductive bump is, for example, solder, gold, or copper. The first input/output portion 25, the first connection terminal 26A, the second connection terminal 26B, and the ground electrode 27 of the first acoustic wave filter 20 are electrically connected to a land La5, a land La61, a land La62, and a land La7 (see FIG. 2B) of the mounting substrate 4, respectively. In plan view in the thickness direction D1 of the mounting substrate 4, the first input/output portion 25, the first connection terminal 26A, the second connection terminal 26B, and the ground electrode 27 of the first acoustic wave filter 20 overlap the land La5, the land La61, the land La62, and the land La7 of the mounting substrate 4, respectively.

As described above, the electronic component 10 includes the first acoustic wave filter 20 and the second acoustic wave filter 30. The first acoustic wave filter 20 includes a first substrate (substrate 1000). The second acoustic wave filter 30 includes a second substrate (substrate 1000). In the electronic component 10, the first substrate and the second substrate are identical to each other. In other words, in the electronic component 10, the first substrate and the second substrate are the identical substrate 1000. In plan view in the thickness direction D1 of the mounting substrate 4, the substrate 1000 has an outer edge that forms a rectangular shape. In the electronic component 10, the first acoustic wave filter 20 and the second acoustic wave filter 30 are arranged in the longitudinal direction of the substrate 1000. In plan view in the thickness direction D1 of the mounting substrate 4, the electronic component 10 has an outer edge that forms a rectangular shape, as with the outer edge of the substrate 1000. The substrate 1000 has a first main surface 1001 and a second main surface 1002 opposed to each other in the thickness direction of the substrate 1000 (the direction along the thickness direction D1 of the mounting substrate 4). In the following description, "on the substrate 1000" means "on the first main surface 1001 of the substrate 1000".

The first acoustic wave filter 20 is a π-shaped filter including a plurality of (three) acoustic wave resonators 24 (see FIG. 1) as described above.

Figure 5:
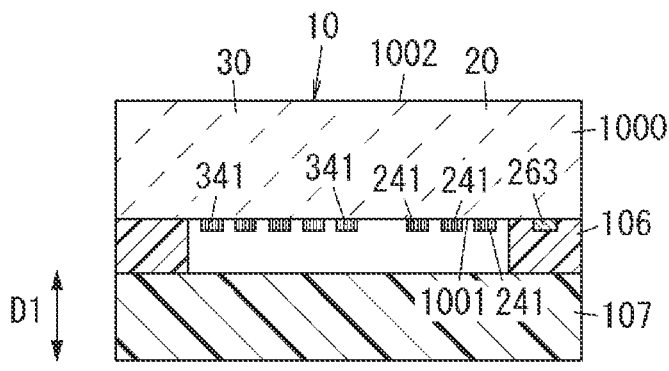
FIG. 5 is a sectional view of the RF module taken along line X2-X2 in FIG. 2A.
Figure 6:
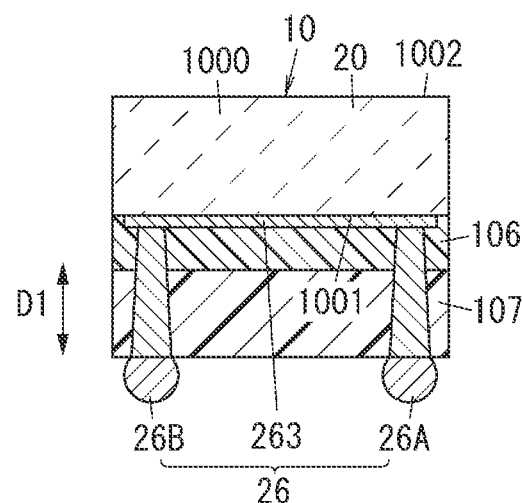
FIG. 6 is a sectional view of the RF module taken along line Y2-Y2 in FIG. 2A.

The first substrate (substrate 1000) is a piezoelectric substrate, and is, for example, a lithium tantalate substrate or a lithium niobate substrate. As illustrated in FIG. 5, the first acoustic wave filter 20 includes a plurality of (for example, three) first interdigital transducer (IDT) electrodes 241 disposed on the first substrate (substrate 1000). The plurality of first IDT electrodes 241 have conductivity. The material of the plurality of first IDT electrodes 241 is, for example, Al (aluminum), Cu (copper), Pt (platinum), Au (gold), Ag (silver), Ti (titanium), Ni (nickel), Cr (chromium), Mo (molybdenum), W (tungsten), Ta (tantalum), Mg (magnesium), Fe (iron), or an alloy mainly containing any of these metals. The plurality of first IDT electrodes 241 may have a structure in which a plurality of metal films made of these metals or alloys are laminated. The plurality of first IDT electrodes 241 include, for example, a laminated film of a first metal film made of a Ti film formed on the substrate 1000 and a second metal film made of an Al film formed on the first metal film. The first metal film functions as an adhesion film. The material of the first metal film is Ti, but is not limited thereto and may be Cr or NiCr, for example. The material of the second metal film is Al, but is not limited thereto and may contain, for example, Al and Cu. The first metal film is thinner than the second metal film. In the first acoustic wave filter 20, each of the plurality of first IDT electrodes 241 is a constituent element of a SAW resonator. In the first acoustic wave filter 20, a plurality of first wiring portions connecting the plurality of first IDT electrodes 241 are disposed on the first substrate (substrate 1000). In the first acoustic wave filter 20, the plurality of first wiring portions constitute the series arm path 250, the parallel arm path 251, and the parallel arm path 252. In the first acoustic wave filter 20, the plurality of first IDT electrodes 241 are connected to each other to connect the plurality of acoustic wave resonators 24 to each other. In the first acoustic wave filter 20, the first input/output portion 25, the first connection terminal 26A, the second connection terminal 26B, the conductor portion 263, and the ground electrode 27 are disposed on the first substrate (substrate 1000) (see FIG. 6).

The second acoustic wave filter 30 is a ladder filter including a plurality of (ten) acoustic wave resonators 34 (see FIG. 1) as described above.

The second substrate (substrate 1000) is a piezoelectric substrate, and is, for example, a lithium tantalate substrate or a lithium niobate substrate. The second acoustic wave filter 30 includes a plurality of (for example, ten) second IDT electrodes 341 (see FIG. 5) disposed on the second substrate (substrate 1000). The material of the plurality of second IDT electrodes 341 is the same as the material of the plurality of first IDT electrodes 241. In the second acoustic wave filter 30, each of the plurality of second IDT electrodes 341 is a constituent element of a SAW resonator. In the second acoustic wave filter 30, a plurality of second wiring portions connecting the plurality of second IDT electrodes 341 are disposed on the second substrate (substrate 1000). In the second acoustic wave filter 30, the plurality of second wiring portions constitute the series arm path 350 and the five parallel arm paths 351 to 355. In the second acoustic wave filter 30, the plurality of second IDT electrodes 341 are connected to each other to connect the plurality of acoustic wave resonators 34 to each other. In the second acoustic wave filter 30, the first input/output portion 35, the second input/output portion 36, and the ground electrode 37 (see FIG. 1) are disposed on the second substrate (substrate 1000). The first input/output portion 35, the second input/output portion 36, and the ground electrode 37 of the second acoustic wave filter 30 each include a conductive bump.

The first acoustic wave filter 20 is disposed on the first main surface 41 of the mounting substrate 4 such that the plurality of first IDT electrodes 241 are located on the mounting substrate 4 side when viewed from the first substrate. The second acoustic wave filter 30 is disposed on the first main surface 41 of the mounting substrate 4 such that the plurality of second IDT electrodes 341 are located on the mounting substrate 4 side when viewed from the second substrate.

The first acoustic wave filter 20 (see FIGS. 5 and 6) further includes constituent elements of a first package. The constituent elements of the first package include, for example, a first spacer layer (a spacer layer 106), a first cover member (a cover member 107), and a plurality of first external terminals (the first input/output portion 25, the first connection terminal 26A, the second connection terminal 26B, and the ground electrode 27). The first spacer layer is disposed on the first substrate. In plan view in the thickness direction of the first substrate, the first spacer layer includes a portion formed along an outer edge of the first substrate. The first spacer layer is electrically insulative. The material of the first spacer layer is epoxy resin, polyimide, or the like. The first cover member is flat-shaped. The first cover member is disposed on the first spacer layer so as to be opposed to the first substrate in the thickness direction of the first substrate. The first cover member overlaps the plurality of first IDT electrodes 241 in the thickness direction of the first substrate, and is apart from the plurality of first IDT electrodes 241 in the thickness direction of the first substrate. The first cover member is electrically insulative. The material of the first cover member is epoxy resin, polyimide, or the like. The plurality of first external terminals are exposed from the first cover member.

The second acoustic wave filter 30 (see FIG. 5) further includes constituent elements of a second package. The constituent elements of the second package include, for example, a second spacer layer (the spacer layer 106), a second cover member (the cover member 107), and a plurality of second external terminals (the first input/output portion 35, the second input/output portion 36, and the ground electrode 37). The second spacer layer is disposed on the second substrate. In plan view in the thickness direction of the second substrate, the second spacer layer includes a portion formed along an outer edge of the second substrate. The second spacer layer is electrically insulative. The material of the second spacer layer is epoxy resin, polyimide, or the like. The second cover member is flat-shaped. The second cover member is disposed on the second spacer layer so as to be opposed to the second substrate in the thickness direction of the second substrate. The second cover member overlaps the plurality of second IDT electrodes 341 in the thickness direction of the second substrate, and is apart from the plurality of second IDT electrodes 341 in the thickness direction of the second substrate. The second cover member is electrically insulative. The material of the second cover member is epoxy resin, polyimide, or the like. The plurality of second external terminals are exposed from the second cover member.

In the electronic component 10, the first spacer layer and the second spacer layer are identical to each other. In other words, in the electronic component 10, the first spacer layer and the second spacer layer are the identical spacer layer 106. Furthermore, in the electronic component 10, the first cover member and the second cover member are the identical cover member 107.

The first substrate and the second substrate described above are not limited to a piezoelectric substrate, and may be, for example, a laminated substrate including a silicon substrate, a low-acoustic-velocity film disposed on the silicon substrate, and a piezoelectric layer disposed on the low-acoustic-velocity film. The material of the piezoelectric layer is, for example, lithium niobate or lithium tantalate. The low-acoustic-velocity film is a film in which the acoustic velocity of a bulk wave propagating therethrough is lower than the acoustic velocity of a bulk wave propagating through the piezoelectric layer. The material of the low-acoustic-velocity film is, for example, silicon oxide. The material of the low-acoustic-velocity film is not limited to silicon oxide. The material of the low-acoustic-velocity film may be, for example, silicon oxide, glass, silicon oxynitride, tantalum oxide, a compound obtained by adding fluorine, carbon, or boron to silicon oxide, or a material mainly containing any of the above materials. In the silicon substrate, the acoustic velocity of a bulk wave propagating therethrough is higher than the acoustic velocity of an acoustic wave propagating through the piezoelectric layer. Here, the bulk wave propagating through the silicon substrate is a bulk wave having the lowest acoustic velocity among a plurality of bulk waves propagating through the silicon substrate.

The laminated substrate may further include a high-acoustic-velocity film disposed between the silicon substrate and the low-acoustic-velocity film. The high-acoustic-velocity film is a film in which the acoustic velocity of a bulk wave propagating therethrough is higher than the acoustic velocity of an acoustic wave propagating through the piezoelectric layer. The material of the high-acoustic-velocity film is, for example, at least one material selected from the group consisting of diamond-like carbon, aluminum nitride, aluminum oxide, silicon carbide, silicon nitride, silicon, sapphire, a piezoelectric material (lithium tantalate, lithium niobate, or quartz), alumina, zirconia, cordierite, mullite, steatite, forsterite, magnesia, and diamond. The material of the high-acoustic-velocity film may be a material mainly containing any of the above-described materials, or a material mainly containing a mixture including any of the above-described materials.

The laminated substrate may include, for example, an adhesion layer interposed between the low-acoustic-velocity film and the piezoelectric layer. The adhesion layer is made of, for example, a resin (epoxy resin or polyimide resin). The laminated substrate may include a dielectric film between the low-acoustic-velocity film and the piezoelectric layer, on the piezoelectric layer, or under the low-acoustic-velocity film.

In the RF module 1, two circuit elements 21 (the first inductor L1 and the second inductor L2) among the plurality of circuit elements 21 of the first circuit 2C of the hybrid filter 2 (see FIG. 1) are mounted on the first main surface 41 of the mounting substrate 4 (see FIG. 2A). "The circuit elements 21 are mounted on the first main surface 41 of the mounting substrate 4" includes that the circuit elements 21 are disposed on (are mechanically connected to) the first main surface 41 of the mounting substrate 4 and that the circuit elements 21 are electrically connected to (an appropriate conductor portion of) the mounting substrate 4. The three circuit elements 21 (the first capacitor C0, the second capacitor C1, and the third capacitor C2) other than the above-described two circuit elements 21 among the plurality of circuit elements 21 are disposed in the mounting substrate 4 (see FIGS. 2B, 3, and 4). In the RF module 1, the inductor L13 and the inductor L25 are mounted on the first main surface 41 of the mounting substrate 4 (see FIG. 2A). In the RF module 1, the inductor L30, the inductor L15, the capacitor C15, the capacitor C25, and the capacitor C35 are disposed in the mounting substrate 4.

As described above, the first inductor L1, the second inductor L2, the inductor L13, and the inductor L25 are mounted on the first main surface 41 of the mounting substrate 4 (see FIG. 2A). Each of the first inductor L1, the second inductor L2, the inductor L13, and the inductor L25 is, for example, a chip inductor. In plan view in the thickness direction D1 of the mounting substrate 4, the first inductor L1, the second inductor L2, the inductor L13, and the inductor L25 each have an outer edge that forms a substantially rectangular shape.

As described above, the first capacitor C0, the second capacitor C1, the third capacitor C2, the capacitor C15, the capacitor C25, and the capacitor C35 are disposed in the mounting substrate 4. As illustrated in FIG. 4, the first capacitor C0 is a capacitor including two conductor pattern portions 45 disposed in the mounting substrate 4. The two conductor pattern portions 45 overlap each other in the thickness direction D1 of the mounting substrate 4 and are apart from each other. As with the first capacitor C0, each of the second capacitor C1, the third capacitor C2, the capacitor C25, and the capacitor C35 includes two conductor pattern portions disposed in the mounting substrate 4.

The inductor L30 and the inductor L15 are each an inductor including a conductor pattern portion disposed in the mounting substrate 4.

As illustrated in FIGS. 3 and 4, the resin layer 5 is disposed on the first main surface 41 of the mounting substrate 4. The resin layer 5 contains a resin (for example, epoxy resin). The resin layer 5 may contain a filler in addition to the resin.

The resin layer 5 covers an outer peripheral surface of the electronic component 10, the first inductor L1, and the second inductor L2. The outer peripheral surface of the electronic component 10 includes four side surfaces that connect the main surface on the mounting substrate 4 side and the main surface on the opposite side from the mounting substrate 4 side of the electronic component 10. In the RF module 1 according to the first embodiment, the resin layer 5 also covers the main surface on the opposite side from the mounting substrate 4 side of the electronic component 10. The resin layer 5 also covers an outer peripheral surface of the first inductor L1 and the main surface on the opposite side from the mounting substrate 4 side of the first inductor L1. The resin layer 5 also covers an outer peripheral surface of the second inductor L2 and the main surface on the opposite side from the mounting substrate 4 side of the second inductor L2.

The resin layer 5 also covers the inductor L13 and the inductor L25. Here, the resin layer 5 covers an outer peripheral surface of the inductor L13 and the main surface on the opposite side from the mounting substrate 4 side of the inductor L13. The resin layer 5 also covers an outer peripheral surface of the inductor L25 and the main surface on the opposite side from the mounting substrate 4 side of the inductor L25.

The metal electrode layer 6 covers the resin layer 5 and is connected to the ground terminal 17. The metal electrode layer 6 has conductivity. In the RF module 1, the metal electrode layer 6 is a shield layer provided for the purpose of electromagnetic shielding between the inside and the outside of the RF module 1. The metal electrode layer 6 has a multilayer structure in which a plurality of metal layers are laminated, but is not limited thereto and may be a single metal layer. The metal layer includes one or more kinds of metals. In a case where the metal electrode layer 6 has a multilayer structure in which a plurality of metal layers are laminated, the metal electrode layer 6 includes, for example, a first stainless steel layer, a Cu layer on the first stainless steel layer, and a second stainless steel layer on the Cu layer. The material of each of the first stainless steel layer and the second stainless steel layer is an alloy containing Fe, Ni, and Cr. In a case where the metal electrode layer 6 is a single metal layer, the metal electrode layer 6 is, for example, a Cu layer. The metal electrode layer 6 includes a first conductor portion 61 and a second conductor portion 62. The first conductor portion 61 covers a main surface 51 on the opposite side from the mounting substrate 4 side of the resin layer 5. The second conductor portion 62 covers an outer peripheral surface 53 of the resin layer 5 and an outer peripheral surface 43 of the mounting substrate 4. The metal electrode layer 6 is in contact with at least a part of an outer peripheral surface of the ground layer of the mounting substrate 4. This makes it possible to cause the metal electrode layer 6 to have a potential equal to that of the ground layer of the mounting substrate 4 in the RF module 1.

(1.2.4) Layout in RF Module

In the RF module 1, as described above, among the plurality of constituent elements of the hybrid filter 2 (see FIG. 1), the first acoustic wave filter 20, the first inductor L1, and the second inductor L2 are mounted on the first main surface 41 of the mounting substrate 4 (see FIG. 2A), and the first capacitor C0, the second capacitor C1, and the third capacitor C2 are disposed in the mounting substrate 4 (see FIG. 2B). In the RF module 1, among the plurality of constituent elements of the second filter 3, the second acoustic wave filter 30 is mounted on the first main surface 41 of the mounting substrate 4 (see FIG. 2A), and the inductor L30 is disposed in the mounting substrate 4.

In the first acoustic wave filter 20, the first connection terminal 26A and the second connection terminal 26B are adjacent to each other in plan view in the thickness direction D1 of the mounting substrate 4. "The first connection terminal 26A and the second connection terminal 26B are adjacent to each other" means that there are no other connection terminals (the first input/output portion and the ground electrode 27) between the first connection terminal 26A and the second connection terminal 26B, and the first connection terminal 26A and the second connection terminal 26B are next to each other.

The third circuit 2B (see FIG. 1) includes, among the plurality of inductors L1 and L2, the first inductor L1 connected to the acoustic wave filter 20 without any of the plurality of capacitors C0, C1, and C2 interposed therebetween. The first inductor L1 is connected directly to the first acoustic wave filter 20. "The first inductor L1 is connected directly to the first acoustic wave filter 20" means that the first inductor L1 is connected to the second connection terminal 26B of the first acoustic wave filter 20 without any of the plurality of circuit elements 21 except the first inductor L1 interposed therebetween. The first inductor L1 is electrically connected via a wiring portion W2 (see FIGS. 2A and 2B) of the mounting substrate 4. In the RF module 1, as illustrated in FIG. 2A, the first acoustic wave filter 20 and the first inductor L1 are adjacent to each other on the first main surface 41 of the mounting substrate 4. "The first acoustic wave filter 20 and the first inductor L1 are adjacent to each other" means that, on the first main surface 41 of the mounting substrate 4, there are no other electronic components (the second acoustic wave filter 30, the circuit elements 21 other than the first inductor L1, the inductor L13, and the inductor L25) between the first acoustic wave filter 20 and the first inductor L1, and the first acoustic wave filter 20 and the first inductor L1 are next to each other. The third circuit 2B includes, among the plurality of inductors L1 and L2, the second inductor L2 connected to the acoustic wave filter 20 without any of the plurality of capacitors C0, C1, and C2 interposed therebetween. The second inductor L2 is connected directly to the first acoustic wave filter 20. "The second inductor L2 is connected directly to the first acoustic wave filter 20" means that the second inductor L2 is connected to the second connection terminal 26B of the first acoustic wave filter 20 without any of the plurality of circuit elements 21 except the second inductor L2 interposed therebetween.

In the RF module 1, the first capacitor C0 of the second circuit 2A (see FIG. 1) and the ground terminal 17 overlap each other in plan view in the thickness direction D1 of the mounting substrate 4 (see FIG. 4). In the RF module 1, a part of the first capacitor C0 and a part of the ground terminal 17 overlap each other. However, the present disclosure is not limited thereto, and a part of the first capacitor C0 and the entirety of the ground terminal 17 may overlap each other, the entirety of the first capacitor C0 and a part of the ground terminal 17 may overlap each other, or the entirety of the first capacitor C0 and the entirety of the ground terminal 17 may overlap each other.

In the RF module 1, the second capacitor C1 of the third circuit 2B (see FIG. 1) is connected to the acoustic wave filter 20 without any of the plurality of circuit elements 21 except the second capacitor C1 interposed therebetween. In the RF module 1, in plan view in the thickness direction D1 of the mounting substrate 4, a part of the first acoustic wave filter 20 and a part of the second capacitor C1 overlap each other (see FIGS. 3 and 4). However, the present disclosure is not limited thereto, and a part of the first acoustic wave filter 20 and the entirety of the second capacitor C1 may overlap each other, for example. In the RF module 1, the first acoustic wave filter 20 and the second capacitor C1 need not necessarily overlap each other in plan view in the thickness direction D1 of the mounting substrate 4.

In the RF module 1, the second capacitor C1 overlaps the second signal terminal 12 in plan view in the thickness direction D1 of the mounting substrate 4 (see FIG. 4). Regarding the second capacitor C1 and the second signal terminal 12, it is sufficient that at least a part of the second capacitor C1 and at least a part of the second signal terminal 12 overlap each other.

In the RF module 1, the third capacitor C2 of the third circuit 2B (see FIG. 1) is connected to the acoustic wave filter 20 via the second inductor L2 among the plurality of circuit elements 21. The third capacitor C2 is connected between the second inductor L2 and the second ground terminal. In the RF module 1, in plan view in the thickness direction D1 of the mounting substrate 4, the first acoustic wave filter 20 and the third capacitor C2 do not overlap each other (see FIG. 4). However, the present disclosure is not limited thereto, and the first acoustic wave filter 20 and the third capacitor C2 may overlap each other in plan view in the thickness direction D1 of the mounting substrate 4. In this case, in the RF module 1, in plan view in the thickness direction D1 of the mounting substrate 4, a part of the first acoustic wave filter 20 may overlap a part of the third capacitor C2, a part of the first acoustic wave filter 20 may overlap the entirety of the third capacitor C2, or the entirety of the first acoustic wave filter 20 may overlap a part of the third capacitor C2.

(1.3) Effects (1.3.1) RF Module

The RF module 1 according to the first embodiment includes the mounting substrate 4, the first signal terminal 11, the second signal terminal 12, the ground terminal 17, and the hybrid filter 2. The mounting substrate 4 has the first main surface 41 and the second main surface 42 opposed to each other. The first signal terminal 11, the second signal terminal 12, and the ground terminal 17 are disposed on the mounting substrate 4. The hybrid filter 2 includes the acoustic wave filter 20 and the first circuit 2C. The acoustic wave filter 20 includes the at least one acoustic wave resonator 24, the first input/output portion 25 connected to the first signal terminal 11, and the second input/output portion 26 connected to the second signal terminal 12. The first circuit 2C includes the plurality of circuit elements 21 and is connected to the second input/output portion 26 of the acoustic wave filter 20. The plurality of circuit elements 21 include the plurality of inductors L1 and L2 and the plurality of capacitors C0, C1, and C2. The hybrid filter 2 has a larger pass band width than the acoustic wave resonator 24. The second input/output portion 26 of the acoustic wave filter 20 includes the first connection terminal 26A, the second connection terminal 26B, and the conductor portion 263. The first connection terminal 26A is connected to the mounting substrate 4. The second connection terminal 26B is located apart from the first connection terminal 26A in plan view in the thickness direction D1 of the mounting substrate 4, and is connected to the mounting substrate 4. The conductor portion 263 connects the first connection terminal 26A and the second connection terminal 26B. The first circuit 2C includes the second circuit 2A and the third circuit 2B. The second circuit 2A is connected between the first connection terminal 26A and the ground terminal 17. The second circuit 2A includes one circuit element 21 (the capacitor C0) among the plurality of inductors L1 and L2 and the plurality of capacitors C0, C1, and C2. The third circuit 2B is connected between the second connection terminal 26B and the second signal terminal 12. The third circuit 2B includes the inductors L1 and L2 among the plurality of inductors L1 and L2, and capacitors C1 and C2 among the plurality of capacitors C0, C1, and C2.

The RF module 1 according to the first embodiment is capable of reducing the degradation of the characteristics. More specifically, the RF module 1 according to the first embodiment is capable of reducing the degradation of the filter characteristics of the hybrid filter 2.

Figure 8:
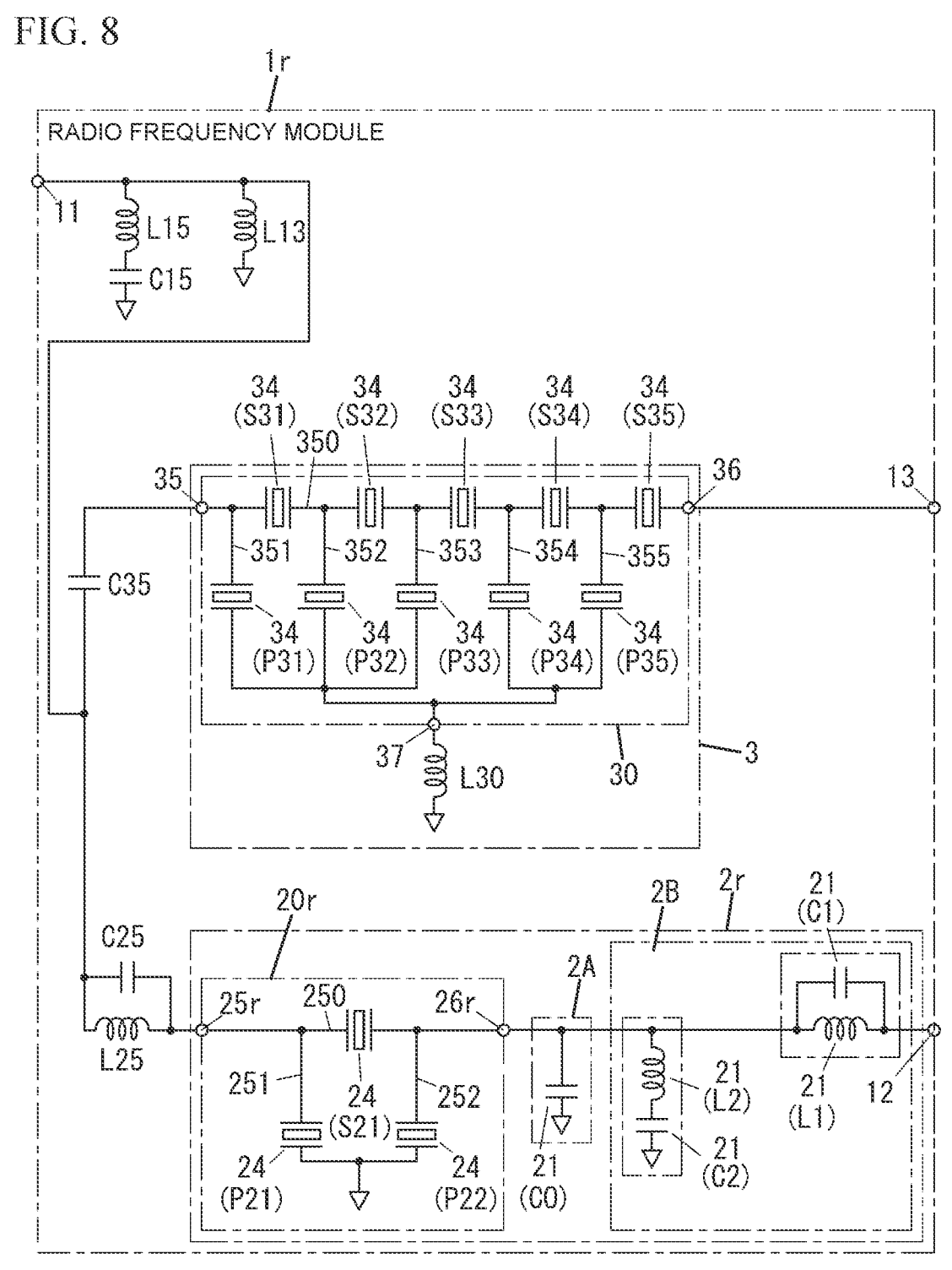
Figure 9A:
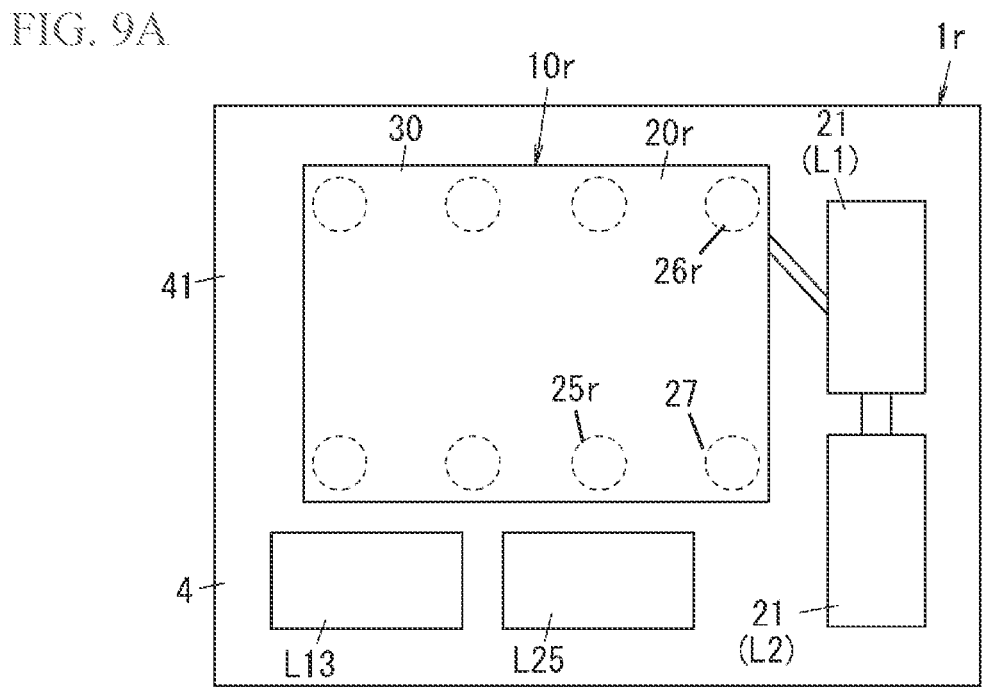
FIG. 9A is a plan view of the RF module.
Figure 9B:
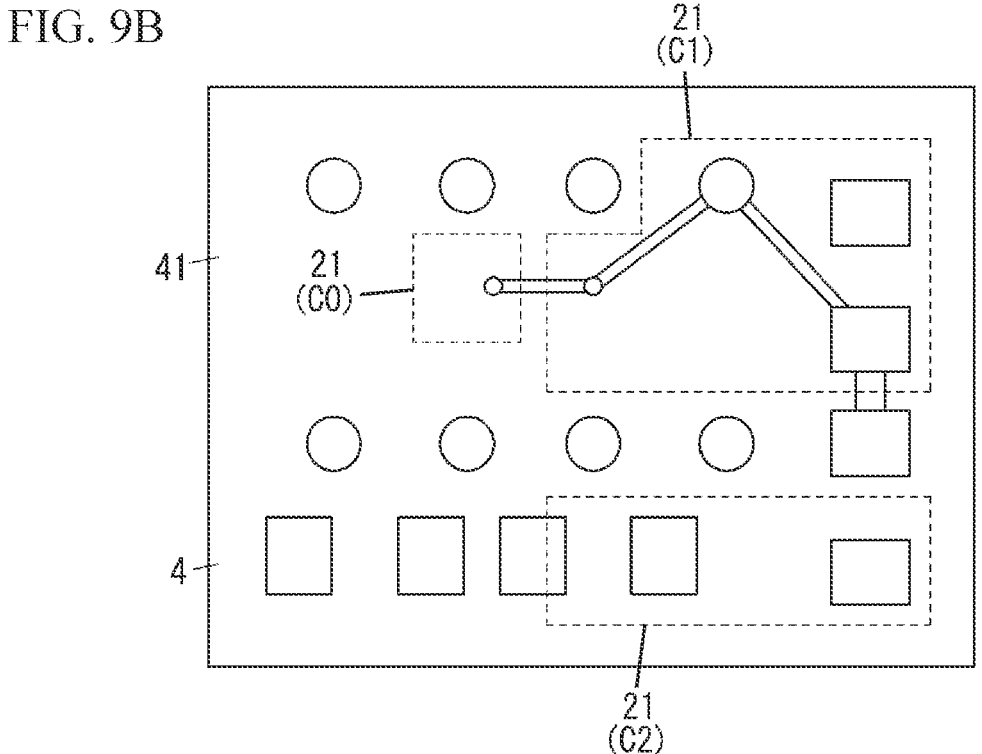
FIG. 9B is a plan view of a mounting substrate in the RF module.

The RF module 1 according to the first embodiment is capable of reducing the degradation of the filter characteristics of the hybrid filter 2, for example, as compared with an RF module 1r according to a comparative example, which will be described with reference to FIGS. 8, 9A, and 9B. As illustrated in FIG. 8, the RF module 1r according to the comparative example is different from the RF module 1 according to the first embodiment in that a first acoustic wave filter 20r includes a first input/output portion 25r and a second input/output portion 26r instead of the first input/output portion 25 and the second input/output portion 26 of the first acoustic wave filter 20. Furthermore, the RF module 1r according to the comparative example is different from the RF module 1 according to the first embodiment in that the second circuit 2A and the third circuit 2B are connected to the second input/output portion 26r constituted by one connection terminal. In the RF module 1r according to the comparative example, an electronic component 10r including the first acoustic wave filter 20r and the second acoustic wave filter 30 is mounted on the first main surface 41 of the mounting substrate 4. In the RF module 1r according to the comparative example, it is necessary to arrange the circuit element 21 of the second circuit 2A (the first capacitor C0) so as not to overlap the plurality of circuit elements 21 of the third circuit 2B (the first inductor L1, the second inductor L2, the second capacitor C1, and the third capacitor C2) and the first acoustic wave filter 20r in plan view in the thickness direction of the mounting substrate 4 (see FIGS. 9A and 9B). Accordingly, in the RF module 1r according to the comparative example, the power loss in the wiring lines tends to increase, and a larger area is required for the hybrid filter 2 in the mounting substrate 4, resulting in an increased size of the the RF module 1r. In the RF module 1r according to the comparative example, even if the positions of the second input/output portion 26 and the ground electrode 27 are reversed, it is necessary to arrange the circuit element 21 of the second circuit 2A so as not to overlap the plurality of circuit elements 21 of the third circuit 2B and the first acoustic wave filter 20r in plan view in the thickness direction D1 of the mounting substrate 4.

In contrast, in the RF module 1 according to the first embodiment, the second input/output portion 26 includes the first connection terminal 26A and the second connection terminal 26B, and thus the plurality of circuit elements 21 of the first circuit 2C are more freely arranged. For example, the first capacitor C0 can be arranged so as to overlap the first acoustic wave filter 20 in plan view in the thickness direction D1 of the mounting substrate 4. Accordingly, in the RF module 1 according to the first embodiment, it is possible to reduce the power loss in the wiring lines of the first circuit 2C and improve the filter characteristics, and it is also possible to reduce the area required for the hybrid filter 2 in the mounting substrate 4 and reduce the size of the RF module 1.

In the RF module 1 according to the first embodiment, the second filter 3 includes the second acoustic wave filter 30 including the acoustic wave resonators 34 different from the acoustic wave resonators 24 of the first acoustic wave filter 20 which is the acoustic wave filter 20. The first acoustic wave filter 20 includes the first substrate. The second acoustic wave filter 30 includes the second substrate. The first substrate and the second substrate are identical to each other. Accordingly, in the RF module 1 according to the first embodiment, because the first substrate and the second substrate are identical to each other, it is possible to reduce the size of the RF module 1 as compared with a case where the first substrate and the second substrate are different substrates. In the RF module 1 according to the first embodiment, because the first substrate and the second substrate are identical to each other, it is possible to increase the area of a heat dissipation path for the heat generated in each of the first acoustic wave filter 20 and the second acoustic wave filter 30, and it is possible to reduce an increase in the temperature of each of the first acoustic wave filter 20 and the second acoustic wave filter 30. More specifically, in the RF module 1 according to the first embodiment, because the first substrate and the second substrate have an increased area and the number of conductive bumps included in the electronic component 10 including the first acoustic wave filter 20 is increased, it is possible to increase the area of the heat dissipation path and reduce an increase in the temperature of each of the first acoustic wave filter 20 and the second acoustic wave filter 30.

In the RF module 1 according to the first embodiment, the first acoustic wave filter 20 allows a transmission signal in the first communication band to pass therethrough, and the second acoustic wave filter 30 allows a transmission signal in the second communication band to pass therethrough. Thus, in the RF module 1 according to the first embodiment, the heat generated when a transmission signal in the first communication band (for example, a transmission signal that has passed through the first transmission filter 111) passes through the first acoustic wave filter 20 is easily dissipated, and it is possible to improve the electric power handling capability of the acoustic wave resonator 24 of the first acoustic wave filter 20. In addition, in the RF module 1 according to the first embodiment, the heat generated when a transmission signal in the second communication band (for example, a transmission signal that has passed through the second transmission filter 112) passes through the second acoustic wave filter 30 is easily dissipated, and it is possible to improve the electric power handling capability of the acoustic wave resonator 34 of the second acoustic wave filter 30.

(1.3.2) Communication Device

The communication device 300 according to the first embodiment includes the signal processing circuit 301 and the RF module 1. The signal processing circuit 301 performs signal processing on an RF signal (transmission signal, reception signal) used in the RF module 1.

The communication device 300 includes the RF module 1, and is thus capable of reducing the degradation of the characteristics.

(1.4) Modification of First Embodiment

Figure 10:
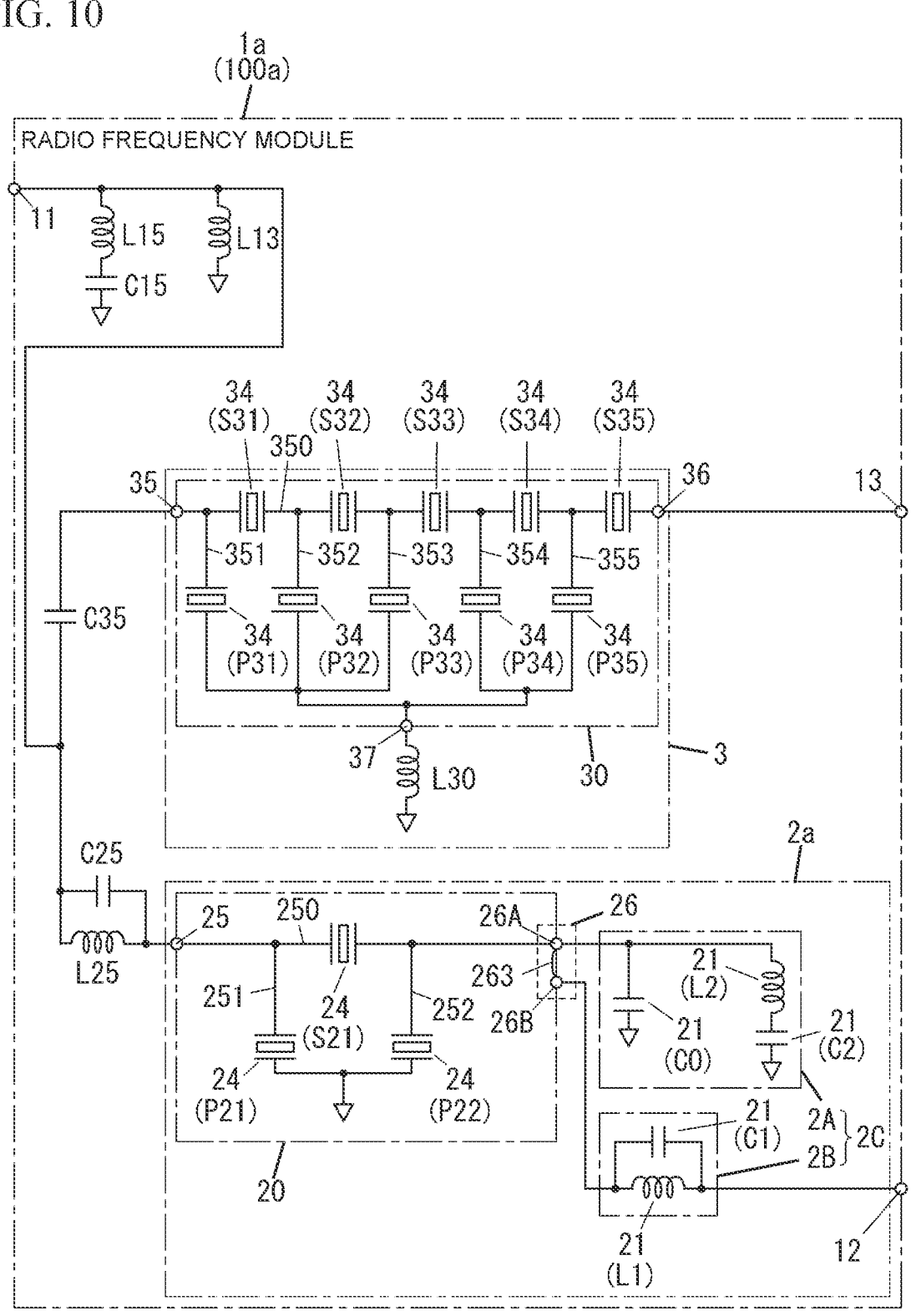
FIG. 10 is a circuit diagram of an RF module according to a modification of the first embodiment.

Hereinafter, an RF module 1a according to a modification of the first embodiment will be described with reference to FIG. 10. Regarding the RF module 1a according to the modification of the first embodiment, constituent elements similar to those of the RF module 1 according to the first embodiment are denoted by the same reference numerals, and the description thereof will be omitted. The circuit configuration of the RF module 1a is similar to the circuit configuration of the RF module 1 according to the first embodiment described with reference to FIG. 1.

The RF module 1a according to the modification includes a hybrid filter 2a (first filter 2a) instead of the hybrid filter 2 (first filter 2) of the RF module 1 according to the first embodiment. The hybrid filter 2a is different from the hybrid filter 2 of the RF module 1 according to the first embodiment in that, in the first circuit 2C, the series circuit composed of the second inductor L2 and the third capacitor C2 is included not in the third circuit 2B but in the second circuit 2A, and is connected between the first connection terminal 26A and the second ground terminal.

The RF module 1a according to the modification, in which the second input/output portion 26 of the first acoustic wave filter 20 includes the first connection terminal 26A, the second connection terminal 26B, and the conductor portion 263, the second circuit 2A is connected to the first connection terminal 26A, and the third circuit 2B is connected to the second connection terminal 26B, is capable of reducing the degradation of the characteristics as with the RF module 1 according to the first embodiment. The RF module 1a according to the modification constitutes a multiplexer 100*a* including the first filter 2*a* and the second filter 3. The multiplexer 100*a* can be used, for example, instead of the multiplexer 100 in the communication device 300 (see FIG. 7) including the RF module 1 (multiplexer 100) according to the first embodiment. In this case, the first filter 2*a* is used instead of the first filter 2 of the multiplexer 100. The first filter 2*a* has a pass band including, for example, 1710 MHz to 2370 MHz and 2496 MHz to 2690 MHz. The second filter 3 has a pass band including 2400 MHz to 2483 MHz. That is, the pass band of the second filter 3 includes the frequency band of the 2.4 GHz band of Wi-Fi (registered trademark).

Second Embodiment

Hereinafter, an RF module 1*b* according to a second embodiment will be described with reference to FIGS. 11, 12A, 12B, 13, and 14. The RF module 1*b* according to the second embodiment is different from the RF module 1 according to the first embodiment in including an acoustic wave filter 20*b* (hereinafter also referred to as a first acoustic wave filter 20*b*) instead of the acoustic wave filter 20 (first acoustic wave filter 20) in the RF module 1 according to the first embodiment. Regarding the RF module 1*b* according to the second embodiment, constituent elements similar to those of the RF module 1 according to the first embodiment are denoted by the same reference numerals, and the description thereof will be omitted.

(2.1) Overview

Figure 11:
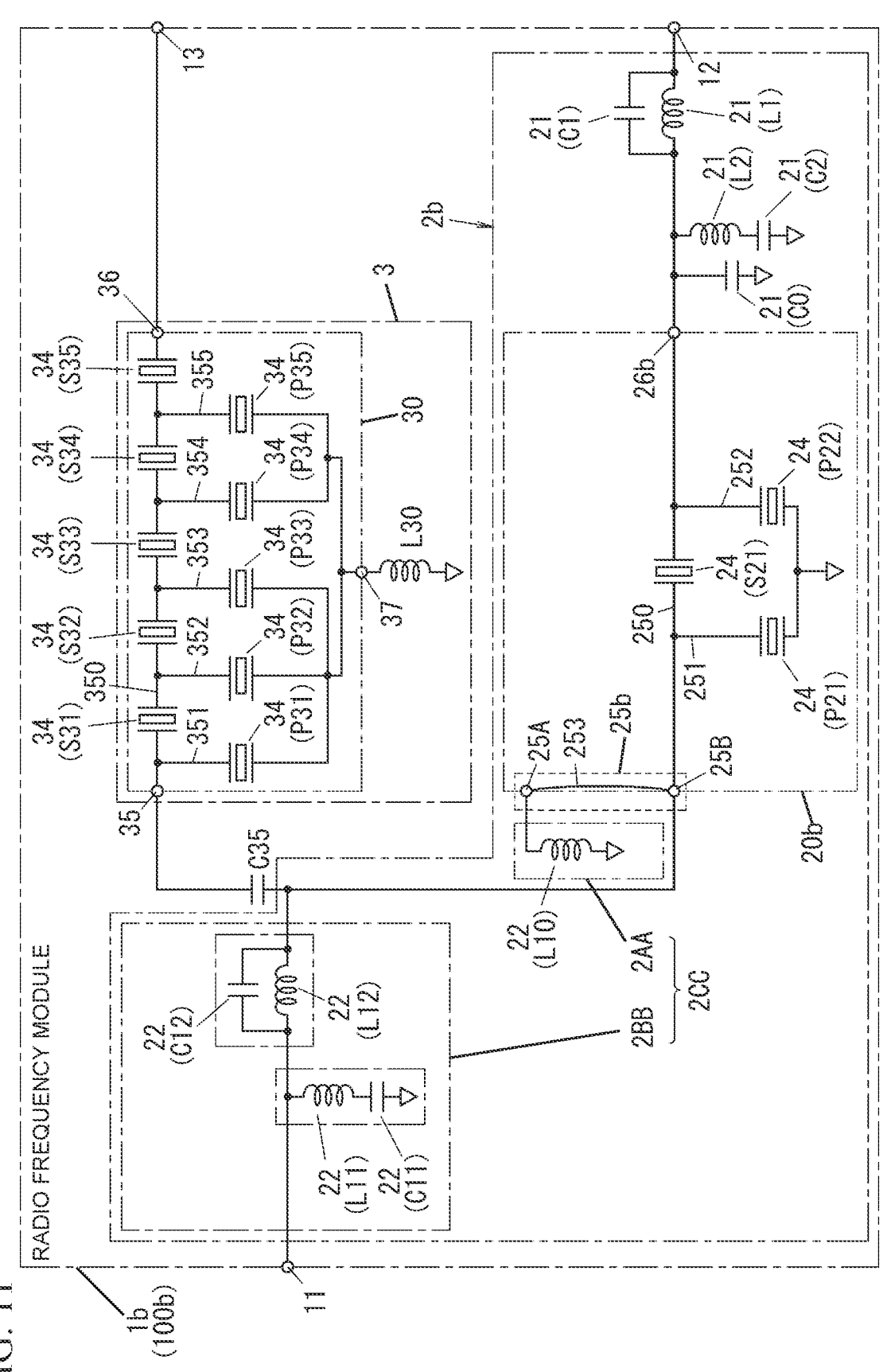
FIG. 11 is a circuit diagram of an RF module according to a second embodiment.
Figure 13:
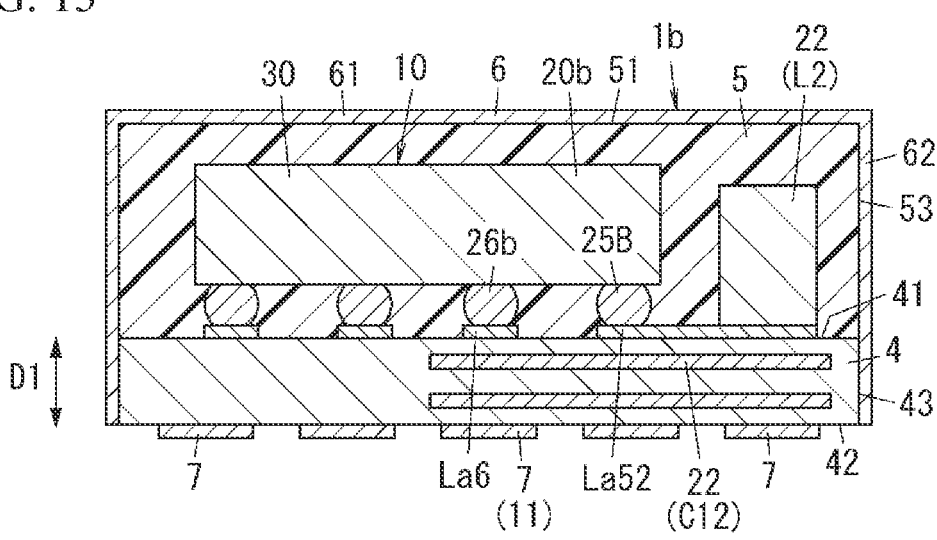
FIG. 13 is a sectional view of the RF module taken along line X1-X1 in FIG. 12A.
Figure 14:
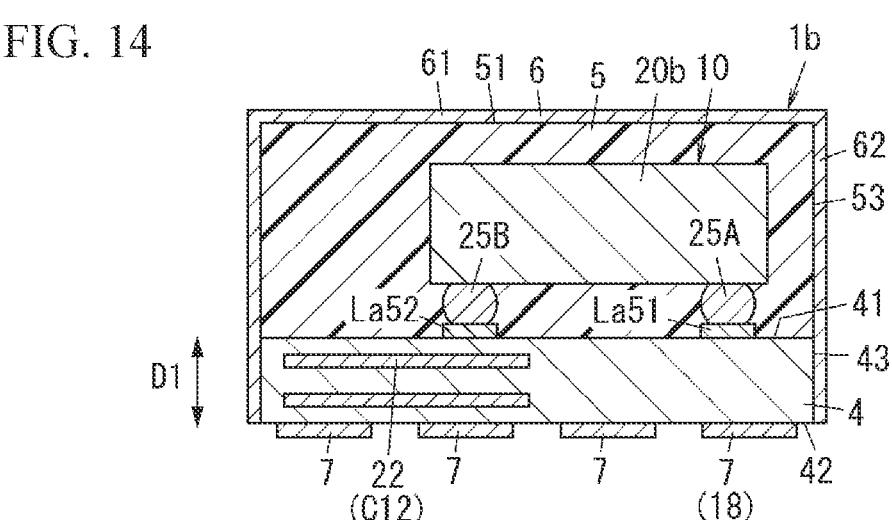
FIG. 14 is a sectional view of the RF module taken along line Y1-Y1 in FIG. 12A.

The RF module 1*b* according to the second embodiment includes a mounting substrate 4 (see FIGS. 12A, 12B, 13, and 14), a first signal terminal 11, a second signal terminal 12, a ground terminal 18 (see FIG. 14), and a hybrid filter 2*b*. As illustrated in FIGS. 13 and 14, the mounting substrate 4 has a first main surface 41 and a second main surface 42 opposed to each other. The first signal terminal 11, the second signal terminal 12, and the ground terminal 18 are disposed on the mounting substrate 4. As illustrated in FIG. 11, the hybrid filter 2*b* includes the acoustic wave filter 20*b* and a first circuit 2CC. The acoustic wave filter 20*b* includes at least one acoustic wave resonator 24, a first input/output portion 25*b* connected to the first signal terminal 11, and a second input/output portion 26*b* connected to the second signal terminal 12. The first circuit 2CC includes a plurality of circuit elements 22 and is connected to the first input/output portion 25*b* of the acoustic wave filter 20*b*. The plurality of circuit elements 22 include a plurality of inductors L10, L11, and L12 and a plurality of capacitors C11 and C12. The hybrid filter 2*b* has a larger pass band width than the acoustic wave resonator 24. The first input/output portion 25*b* of the acoustic wave filter 20*b* includes a first connection terminal 25A, a second connection terminal 25B, and a conductor portion 253. The first connection terminal 25A is connected to the mounting substrate 4. The second connection terminal 25B is located apart from the first connection terminal 25A in plan view in a thickness direction D1 of the mounting substrate 4 (see FIG. 12A), and is connected to the mounting substrate 4. The conductor portion 253 connects the first connection terminal 25A and the second connection terminal 25B. The first circuit 2CC includes a second circuit 2AA and a third circuit 2BB. The second circuit 2AA is connected between the first connection terminal 25A and the ground terminal 18 (see FIG. 14). The second circuit 2AA includes one circuit element 22 (the inductor L10) connected to the ground terminal 18 among the plurality of inductors L10, L11, and L12 and the plurality of capacitors C11 and C12. The third circuit 2BB is connected between the second connection terminal 25B and the first signal terminal 11. The third circuit 2BB includes at least the inductors L11 and L12 among the plurality of inductors L10, L11, and L12, and two capacitors C11 and C12 among the plurality of capacitors C11 and C12.

In the RF module 1*b*, the hybrid filter 2*b* (hereinafter also referred to as a first filter 2*b*) is connected between the first signal terminal 11 and the second signal terminal 12.

The RF module 1*b* further includes a third signal terminal 13 and a second filter 3. The third signal terminal 13 is disposed on the mounting substrate 4. The second filter 3 is connected between the first signal terminal 11 and the third signal terminal 13. The second filter 3 includes a second acoustic wave filter 30 and an inductor L30. The inductor L30 is disposed in the mounting substrate 4 and is connected between a ground electrode 37 of the second acoustic wave filter 30 and a ground terminal of the mounting substrate 4.

The RF module 1*b* constitutes a multiplexer 100*b* including the first filter 2*b* and the second filter 3. The multiplexer 100*b* can be used, for example, instead of the multiplexer 100 in the communication device 300 (see FIG. 7) including the RF module 1 (multiplexer 100) according to the first embodiment. In this case, the first filter 2*b* is used instead of the first filter 2 of the multiplexer 100. The first filter 2*b* has a pass band including, for example, 1710 MHz to 2370 MHz and 2496 MHz to 2690 MHz. The second filter 3 has a pass band including 2400 MHz to 2483 MHz. That is, the pass band of the second filter 3 includes the frequency band of the 2.4 GHz band of Wi-Fi (registered trademark).

(2.2) RF Circuit Including RF Module, and Communication Device (2.2.1) Circuit Configurations of RF Circuit Including RF Module, and Communication Device The RF module 1*b* is used, for example, instead of the RF module 1 in the RF circuit 200 (see FIG. 7) described in the first embodiment. Thus, the RF module 1*b* is used, for example, instead of the RF module 1 in the communication device 300 (see FIG. 7) described in the first embodiment.

(2.2.2) Circuit Configuration of RF Module

As illustrated in FIG. 11, the RF module 1*b* includes the first signal terminal 11, the second signal terminal 12, the third signal terminal 13, the hybrid filter 2*b* (first filter 2*b*), and the second filter 3.

The hybrid filter 2*b* is connected between the first signal terminal 11 and the second signal terminal 12. The hybrid filter 2*b* includes the first acoustic wave filter 20*b* and the first circuit 2CC. The first acoustic wave filter 20 includes at least one acoustic wave resonator 24 (for example, three acoustic wave resonators 24).

Figures 12A, 12B:
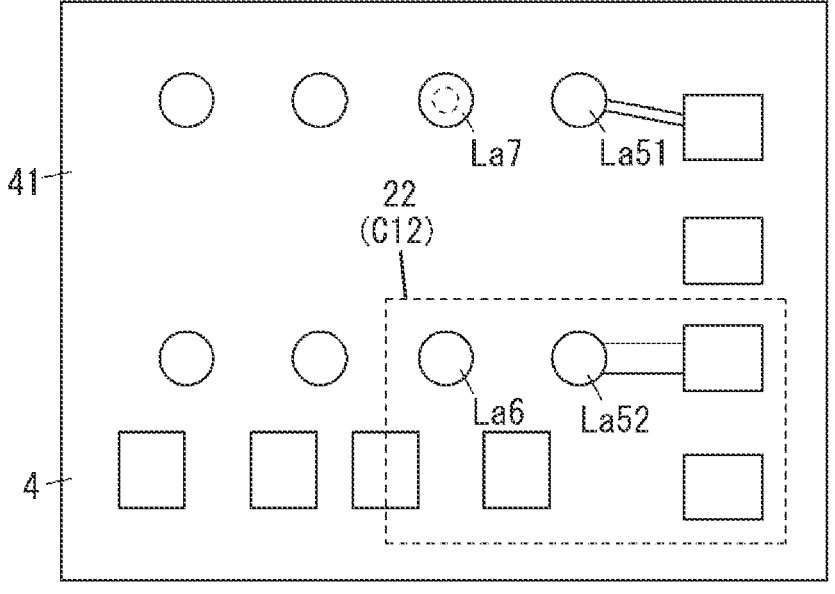
FIG. 12A is a plan view of the RF module.
FIG. 12B is a plan view of a mounting substrate in the RF module.

The first acoustic wave filter 20*b* includes three acoustic wave resonators 24, the first input/output portion 25*b* connected to the first signal terminal 11, the second input/output portion 26*b* connected to the second signal terminal 12, and a ground electrode 27 (see FIG. 12A). The three acoustic wave resonators 24 include one series arm resonator S21 and two parallel arm resonators P21 and P22. The first input/output portion 25*b* includes the first connection terminal 25A, the second connection terminal 25B, and the conductor portion 253 connecting the first connection terminal 25A and the second connection terminal 25B. The first connection terminal 25A and the second connection terminal 25B are connected by the conductor portion 253. The conductor portion 253 is a wiring portion for causing the first connection terminal 25A and the second connection terminal 25B to be at the same potential (equipotential).

The series arm resonator S21 is disposed on a path 250 (hereinafter also referred to as a series arm path 250)

between the first input/output portion 25b and the second input/output portion 26b. The series arm resonator S21 is connected between the first input/output portion 25b and the second input/output portion 26b.

The parallel arm resonator P21 is disposed on a path 251 (parallel arm path 251). The path 251 is between the ground electrode 27 and a path between the first input/output portion 25b and the series arm resonator S21 in the series arm path 250. The parallel arm resonator P22 is disposed on a path 252 (parallel arm path 252). The path 252 is between the ground electrode 27 and a path between the series arm resonator S21 and the second input/output portion 26b in the series arm path 250.

The first circuit 2CC includes the plurality of circuit elements 22. The first circuit 2CC is connected between the first input/output portion 25b of the first acoustic wave filter 20b and the first signal terminal 11. The first circuit 2CC is an LC circuit (more specifically, an LC filter). The plurality of circuit elements 22 include the plurality of inductors L10, L11, and L12 and the plurality of capacitors C11 and C12. The first circuit 2CC includes the second circuit 2AA and the third circuit 2BB.

The second circuit 2AA is connected between the first connection terminal 25A of the first acoustic wave filter 20b and the ground terminal 18 of the RF module 1b. The second circuit 2AA includes only the inductor L10 (hereinafter also referred to as a first inductor L10) among the plurality of inductors L10, L11, and L12 and the plurality of capacitors C11 and C12. The second circuit 2AA is a shunt circuit including the inductor L10 connected between the first connection terminal 25A of the first acoustic wave filter 20b and the ground terminal 18 (hereinafter also referred to as a first ground terminal 18) of the RF module 1b.

The third circuit 2BB is connected to the second connection terminal 25B. The third circuit 2BB includes all the plurality of circuit elements 22 except the circuit element 22 included in the second circuit 2AA (the inductor L10). In the RF module 1b according to the second embodiment, the third circuit 2BB includes the two inductors L11 and L12 and the two capacitors C11 and C12. Hereinafter, for convenience of description, the inductor L11 may be referred to as a second inductor L11, and the inductor L12 may be referred to as a third inductor L12. Hereinafter, for convenience of description, the capacitor C11 may be referred to as a first capacitor C11, and the capacitor C12 may be referred to as a second capacitor C12.

The third inductor L12 is connected in series to the first acoustic wave filter 20b. More specifically, the third inductor L12 is connected between the second connection terminal 25B of the first acoustic wave filter 20b and the first signal terminal 11. The third inductor L12 has one end connected to the second connection terminal 25B of the first acoustic wave filter 20b, and has the other end connected to the first signal terminal 11. Accordingly, the third inductor L12 is connected in series to the series arm resonator S21 of the first acoustic wave filter 20b. The second capacitor C12 is connected in parallel to the third inductor L12. In the third circuit 2BB, a series circuit composed of the second inductor L11 and the first capacitor C11 is connected between the ground (second ground terminal) of the RF module 1b and a path between the third inductor L12 and the first signal terminal 11. The series circuit composed of the second inductor L11 and the first capacitor C11 is a shunt circuit connected between the first signal terminal 11 and the second ground terminal. The second ground terminal may be identical to the first ground terminal 18, or may be a ground terminal different from the first ground terminal 18. The hybrid filter 2b is a filter including the first acoustic wave filter 20b and an LC filter (the first circuit 2CC). The hybrid filter 2b has a pass band width larger than that in a case where the hybrid filter 2b is constituted only by the first acoustic wave filter 20b. The hybrid filter 2b has improved attenuation characteristics near the pass band as compared with a case where the hybrid filter 2b is constituted only by the LC filter. The hybrid filter 2b has a pass band width that is a frequency range in which the insertion loss is 3 dB or less in the filter characteristics. As described above, the hybrid filter 2b has a larger pass band width than the acoustic wave resonator 24. The pass band width of the acoustic wave resonator 24 is a band width ratio of the acoustic wave resonator 24, and is a difference between the anti-resonant frequency and the resonant frequency of the acoustic wave resonator 24.

In the RF module 1b, the hybrid filter 2b includes, in addition to the LC filter constituted by the first circuit 2CC (hereinafter also referred to as a first LC filter), a second LC filter connected between the second input/output portion 26b of the first acoustic wave filter 20b and the second signal terminal 12. The second LC filter includes a plurality of circuit elements 21. The plurality of circuit elements 21 include a plurality of inductors L1 and L2 and a plurality of capacitors C0, C1, and C2.

In the second LC filter, the capacitor C0 is connected between the second input/output portion 26b of the first acoustic wave filter 20b and a ground terminal 17 (hereinafter also referred to as a third ground terminal 17) of the RF module 1b. In the second LC filter, the inductor L1 is connected in series to the first acoustic wave filter 20b. More specifically, the inductor L1 is connected between the second input/output portion 26b of the first acoustic wave filter 20b and the second signal terminal 12. The inductor L1 has one end connected to the second input/output portion 26b of the first acoustic wave filter 20b, and has the other end connected to the second signal terminal 12. Accordingly, the inductor L1 is connected in series to the series arm resonator S21 of the first acoustic wave filter 20b. The capacitor C1 is connected in parallel to the inductor L1. In the second LC filter, a series circuit composed of the inductor L2 and the capacitor C2 is connected between a ground terminal (hereinafter also referred to as a fourth ground terminal) of the RF module 1b and a path between the second input/output portion 26b of the first acoustic wave filter 20b and the inductor L1. The series circuit composed of the inductor L2 and the capacitor C2 is a shunt circuit connected between the second input/output portion 26b of the first acoustic wave filter 20b and the fourth ground terminal of the RF module 1b. The fourth ground terminal may be identical to the third ground terminal 17, or may be a ground terminal different from the third ground terminal 17.

The second filter 3 is connected between the first signal terminal 11 and the third signal terminal 13. The second filter 3 includes the second acoustic wave filter 30 and the inductor L30. The second acoustic wave filter 30 includes at least one acoustic wave resonator 34 (for example, ten acoustic wave resonators 34).

The second acoustic wave filter 30 includes ten acoustic wave resonators 34, a first input/output portion 35 connected to the first signal terminal 11, a second input/output portion 36 connected to the third signal terminal 13, and the ground electrode 37. The ten acoustic wave resonators 34 include five series arm resonator S31, S32, S33, S34, and S35 and five parallel arm resonators P31, P32, P33, P34, and P35.

The inductor L30 has one end connected to the ground electrode 37 of the second acoustic wave filter 30, and has the other end connected to the ground (ground terminal) of the RF module 1b.

The RF module 1b further includes a capacitor C35, and the first input/output portion 35 of the second acoustic wave filter 30 is connected to a path between the second connection terminal 25B of the first acoustic wave filter 20b of the hybrid filter 2b and the third inductor L12 via the capacitor C35.

(2.2.3) Structure of RF Module

Hereinafter, the structure of the RF module 1b will be described with reference to FIGS. 12A, 12B, 13, and 14.

The RF module 1b includes the mounting substrate 4, the first signal terminal 11, the second signal terminal 12 (see FIG. 11), the ground terminal 18 (see FIG. 14), the first acoustic wave filter 20b, the first inductor L10, the second inductor L11, the third inductor L12, the first capacitor C11, and the second capacitor C12. The RF module 1b further includes the third signal terminal 13 (see FIG. 11), the second acoustic wave filter 30, and the inductor L30. The RF module 1b further includes the inductor L1, the inductor L2, the capacitor C0, the capacitor C1, the capacitor C2, and the capacitor C35. The RF module 1b further includes a resin layer 5 (see FIGS. 13 and 14). The RF module 1b further includes a metal electrode layer 6 (see FIGS. 13 and 14).

The mounting substrate 4 has the first main surface 41 and the second main surface 42 opposed to each other in the thickness direction D1 of the mounting substrate 4. The mounting substrate 4 is, for example, a multilayer substrate including a plurality of dielectric layers and a plurality of conductive layers. The plurality of dielectric layers and the plurality of conductive layers are laminated in the thickness direction D1 of the mounting substrate 4. The plurality of conductive layers are formed in a certain pattern determined for each layer. The plurality of conductive layers each include one or more conductor portions in one plane orthogonal to the thickness direction D1 of the mounting substrate 4. The material of each conductive layer is, for example, copper. The plurality of conductive layers include a ground layer. In the RF module 1, the ground terminal 18 and the ground layer are electrically connected to each other via a via-conductor or the like included in the mounting substrate 4. The mounting substrate 4 is, for example, an LTCC substrate. The mounting substrate 4 is not limited to an LTCC substrate and may be, for example, a printed wiring board, an HTCC substrate, or a resin multilayer substrate. The mounting substrate 4 has an outer edge that forms a quadrangular shape in plan view in the thickness direction D1 of the mounting substrate 4.

A plurality of external connection terminals 7 (see FIGS. 13 and 14) included in the RF module 1b are disposed on the second main surface 42 of the mounting substrate 4. The plurality of external connection terminals 7 include the first signal terminal 11, the second signal terminal 12, the third signal terminal 13, the first ground terminal 18, and the second ground terminal. The first ground terminal 18 and the second ground terminal are electrically connected to the ground layer of the mounting substrate 4. The ground layer is a circuit ground of the RF module 1b.

In the RF module 1b, two circuit elements 22 (the inductor L10 and the inductor L12) among the plurality of circuit elements 22 of the first circuit 2CC of the hybrid filter 2b (see FIG. 11) are mounted on the first main surface 41 of the mounting substrate 4. "The circuit elements 22 are mounted on the first main surface 41 of the mounting substrate 4" includes that the circuit elements 22 are disposed on (are mechanically connected to) the first main surface 41 of the mounting substrate 4 and that the circuit elements 22 are electrically connected to (an appropriate conductor portion of) the mounting substrate 4. The three circuit elements 21 (the inductor L11, the capacitor C11, and the capacitor C12) other than the above-described two circuit elements 22 among the plurality of circuit elements 22 are disposed in the mounting substrate 4. In the RF module 1b, the inductor L1 and the inductor L2 are mounted on the first main surface 41 of the mounting substrate 4. In the RF module 1b, the inductor L30 and the capacitor C35 are disposed in the mounting substrate 4.

In the RF module 1b, an electronic component 10 including the first acoustic wave filter 20b and the second acoustic wave filter 30 is mounted on the first main surface 41 of the mounting substrate 4. In the RF module 1b according to the second embodiment, the first connection terminal 25A, the second connection terminal 25B, the second input/output portion 26b, and the ground electrode 27 of the first acoustic wave filter 20b are connected to the mounting substrate 4.

As described above, the electronic component 10 includes the first acoustic wave filter 20b and the second acoustic wave filter 30. The first acoustic wave filter 20b includes a first substrate. The second acoustic wave filter 30 includes a second substrate. In the electronic component 10, the first substrate and the second substrate are identical to each other. In other words, in the electronic component 10, the first substrate and the second substrate are an identical substrate. In plan view in the thickness direction D1 of the mounting substrate 4, the substrate has an outer edge that forms a rectangular shape. In the electronic component 10, the first acoustic wave filter 20b and the second acoustic wave filter 30 are arranged in the longitudinal direction of the substrate.

The conductor portion 253 of the first input/output portion 25b of the acoustic wave filter 20b is a wiring portion for causing the first connection terminal 25A and the second connection terminal 25B to be at the same potential (equipotential). In the first acoustic wave filter 20b, the first connection terminal 25A, the second connection terminal 25B, the second input/output portion 26b, and the ground electrode 27 each include a conductive bump. The material of the conductive bump includes, for example, solder, gold, or copper. The first connection terminal 25A, the second connection terminal 25B, the second input/output portion 26b, and the ground electrode 27 of the first acoustic wave filter 20b are electrically connected to a land La51, a land La52, a land La6, and a land La7 (see FIG. 12B) of the mounting substrate 4, respectively. In plan view in the thickness direction D1 of the mounting substrate 4, the first connection terminal 25A, the second connection terminal 25B, the second input/output portion 26b, and the ground electrode 27 of the first acoustic wave filter 20b overlap the land La51, the land La52, the land La6, and the land La7 of the mounting substrate 4, respectively.

(2.3) Effects (2.3.1) RF Module

The RF module 1b according to the second embodiment includes the mounting substrate 4, the first signal terminal 11, the second signal terminal 12, the ground terminal 18, and the hybrid filter 2b. The mounting substrate 4 has the first main surface 41 and the second main surface 42 opposed to each other. The first signal terminal 11, the second signal terminal 12, and the ground terminal 18 are disposed on the mounting substrate 4. The hybrid filter 2b includes the acoustic wave filter 20b and the first circuit 2CC. The acoustic wave filter 20b includes the at least one acoustic wave resonator 24, the first input/output portion 25b connected to the first signal terminal 11, and the second input/output portion 26b connected to the second signal terminal 12. The first circuit 2CC includes the plurality of circuit elements 22 and is connected to the first input/output portion 25b of the acoustic wave filter 20b. The plurality of circuit elements 22 include the plurality of inductors L10, L11, and L12 and the plurality of capacitors C11 and C12. The hybrid filter 2b has a larger pass band width than the acoustic wave resonator 24. The first input/output portion 25b of the acoustic wave filter 20b includes the first connection terminal 25A, the second connection terminal 25B, and the conductor portion 253. The first connection terminal 25A is connected to the mounting substrate 4. The second connection terminal 25B is located apart from the first connection terminal 25A in plan view in the thickness direction D1 of the mounting substrate 4, and is connected to the mounting substrate 4. The conductor portion 253 connects the first connection terminal 25A and the second connection terminal 25B. The first circuit 2CC includes the second circuit 2AA and the third circuit 2BB. The second circuit 2AA is connected between the first connection terminal 25A and the ground terminal 18. The second circuit 2AA includes one circuit element 22 (the inductor L10) among the plurality of inductors L10, L11, and L12 and the plurality of capacitors C11 and C12. The third circuit 2BB is connected between the second connection terminal 25B and the first signal terminal 11. The third circuit 2BB includes two inductors L11 and L12 among the plurality of inductors L10, L11, and L12, and two capacitors C11 and C12 among the plurality of capacitors C11 and C12.

The RF module 1b according to the second embodiment is capable of reducing the degradation of the characteristics. More specifically, the RF module 1b according to the second embodiment is capable of reducing the degradation of the filter characteristics of the hybrid filter 2b.

The RF module 1b according to the second embodiment, in which the first input/output portion 25b of the acoustic wave filter 20b includes the first connection terminal 25A, the second connection terminal 25B, and the conductor portion 253, the second circuit 2AA is connected to the first connection terminal 25A, and the third circuit 2BB is connected to the second connection terminal 25B, is capable of reducing the degradation of the characteristics.

In the RF module 1b according to the second embodiment, the first input/output portion 25b includes the first connection terminal 25A and the second connection terminal 25B. Thus, the plurality of circuit elements 22 of the first circuit 2CC are more freely arranged, the power loss in the wiring lines of the first circuit 2CC can be reduced, and the filter characteristics can be improved. Furthermore, the area required for the hybrid filter 2b in the mounting substrate 4 can be reduced, and the size of the RF module 1b can be reduced.

(2.3.2) Communication Device

The communication device 300 according to the second embodiment (see FIG. 7) includes the signal processing circuit 301 and the RF module 1b. The signal processing circuit 301 performs signal processing on an RF signal (transmission signal, reception signal) used in the RF module 1b.

The communication device 300 includes the RF module 1b, and is thus capable of reducing the degradation of the characteristics.

Modifications

The above-described first and second embodiments and so forth are each merely one of various embodiments of the present disclosure. The above-described first and second embodiments and so forth can be variously changed according to design or the like as long as the possible benefit of the present disclosure can be achieved.

For example, in the RF module 1 according to the first embodiment, the second circuit 2A connected between the first connection terminal 26A and the second connection terminal 26B includes the capacitor C0. However, the present disclosure is not limited thereto, and an inductor may be included instead of the capacitor C0. In the RF module 1b according to the second embodiment, the second circuit 2AA connected between the first connection terminal 25A and the second connection terminal 25B includes the inductor L10. However, the present disclosure is not limited thereto, and a capacitor may be included instead of the inductor L10.

The RF module 1 need not necessarily be the multiplexer 100, and may have a configuration including neither the second acoustic wave filter 30 nor the inductor L30. That is, the electronic component 10 may have a configuration including only the first acoustic wave filter 20 among the first acoustic wave filter 20 and the second acoustic wave filter 30. The RF module 1 may have a configuration including none of the inductor L13, the inductor L15, the inductor L25, the capacitor C15, the capacitor C25, and the capacitor C35.

The multiplexer 100 constituting the RF module 1 is not limited to a diplexer, and may be, for example, a triplexer including a third filter in addition to the first filter 2 and the second filter 3. Alternatively, the multiplexer 100 may be a quadplexer including a third filter and a fourth filter in addition to the first filter 2 and the second filter 3. The second acoustic wave filter 30 may be an electronic component different from the electronic component including the first acoustic wave filter 20.

The first acoustic wave filters 20 and 20b are not limited to a π-shaped filter, and may be, for example, a T-shaped filter or a ladder filter. The first acoustic wave filters 20 and 20b need not necessarily include a plurality of acoustic wave resonators 24, and only need to include at least one acoustic wave resonator 24. The second acoustic wave filter 30 is not limited to a ladder filter, and may be, for example, a π-shaped filter or a T-shaped filter. The second acoustic wave filter 30 need not necessarily include a plurality of acoustic wave resonators 34, and only needs to include at least one acoustic wave resonator 34.

In the hybrid filter 2, the plurality of circuit elements 21 only need to be disposed on or in the mounting substrate 4, and the circuit element 21 mounted on the first main surface 41 of the mounting substrate 4 may be disposed in the mounting substrate 4. The circuit element 21 disposed in the mounting substrate 4 may be mounted on the first main surface 41 of the mounting substrate 4. For example, at least one of the plurality of capacitors C0, C1, and C2 may be a chip capacitor mounted on the first main surface 41 of the mounting substrate 4.

The first acoustic wave filters 20 and 20b are not limited to SAW filters, and may be bulk acoustic wave (BAW) filters. In the BAW filter, each of the plurality of acoustic wave resonators 24 is a BAW resonator.

The second acoustic wave filter 30 is not limited to a SAW filter, and may be a BAW filter. In the BAW filter, each of the plurality of acoustic wave resonators 34 is a BAW resonator.

The first acoustic wave filters 20 and 20b and the second acoustic wave filter 30 may each be, for example, an acoustic wave filter using a boundary acoustic wave, a Lamb wave, or the like. The second filter 3 need not necessarily include the second acoustic wave filter 30, and may be an LC filter.

The RF modules 1 and 1b need not necessarily include the metal electrode layer 6 covering the resin layer 5.

The plurality of external connection terminals 7 (the first signal terminal 11, the second signal terminal 12, the third signal terminal 13, the first ground terminal 17, and the second ground terminal) in the RF module 1 may each be a ball bump. The material of the ball bump constituting each of the plurality of external connection terminals 7 is, for example, gold, copper, solder, or the like.

Figure 7:
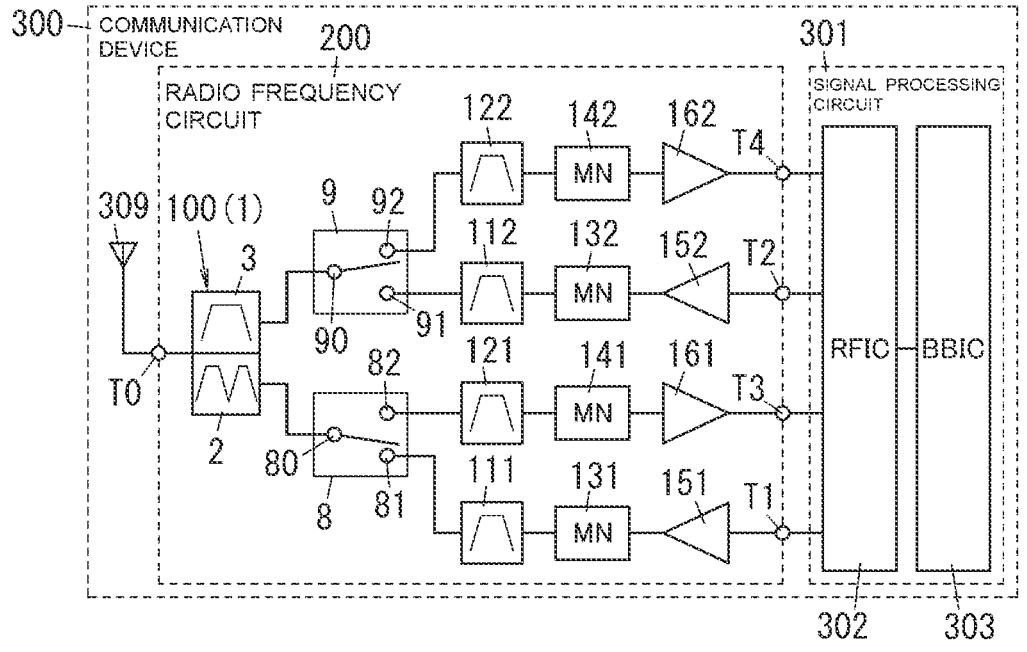
FIG. 7 is a circuit configuration diagram of a communication device including the RF module.

The circuit configuration of the RF circuit 200 is not limited to the above-described example illustrated in FIG. 7. The RF circuit 200 may have, as a circuit configuration, for example, an RF front-end circuit that supports Multi Input Multi Output (MIMO) or Evolved-Universal Terrestrial Radio Access New Radio Dual Connectivity (ENDC).

Aspects

The specification discloses the following aspects.

A radio frequency module (1; 1a) according to a first aspect includes a mounting substrate (4), a first signal terminal (11), a second signal terminal (12), a ground terminal (17), and a hybrid filter (2; 2a). The mounting substrate (4) has a first main surface (41) and a second main surface (42) opposed to each other. The first signal terminal (11), the second signal terminal (12), and the ground terminal (17) are disposed on the mounting substrate (4). The hybrid filter (2; 2a) includes an acoustic wave filter (20) and a first circuit (2C). The acoustic wave filter (20) includes at least one acoustic wave resonator (24), a first input/output portion (25) connected to the first signal terminal (11), and a second input/output portion (26) connected to the second signal terminal (12). The first circuit (2C) includes a plurality of circuit elements (21) and is connected to the second input/output portion (26) of the acoustic wave filter (20). The plurality of circuit elements (21) include a plurality of inductors (L1, L2) and a plurality of capacitors (C0, C1, C2). The hybrid filter (2; 2a) has a larger pass band width than the acoustic wave resonator (24). The second input/output portion (26) of the acoustic wave filter (20) includes a first connection terminal (26A), a second connection terminal (26B), and a conductor portion (263). The first connection terminal (26A) is connected to the mounting substrate (4). The second connection terminal (26B) is located apart from the first connection terminal (26A) in plan view in a thickness direction (D1) of the mounting substrate (4) and is connected to the mounting substrate (4). The conductor portion (263) connects the first connection terminal (26A) and the second connection terminal (26B). The first circuit (2C) includes a second circuit (2A) and a third circuit (2B). The second circuit (2A) is connected between the first connection terminal (26A) and the ground terminal (17). The second circuit (2A) includes one circuit element (capacitor C0) connected to the ground terminal (17) among the plurality of inductors (L1, L2) and the plurality of capacitors (C0, C1, C2). The third circuit (2B) is connected to the second connection terminal (26B). The third circuit (2B) includes at least one inductor (L2) among the plurality of inductors (L1, L2) and at least one capacitor (C2) among the plurality of capacitors (C0, C1, C2).

The radio frequency module (1; 1a) according to the first aspect is capable of reducing the degradation of the characteristics.

In a radio frequency module (1; 1a) according to a second aspect, in the first aspect, the first connection terminal (26A) and the second connection terminal (26B) are adjacent to each other in plan view in the thickness direction (D1) of the mounting substrate (4).

The radio frequency module (1; 1a) according to the second aspect is capable of making the potential of the first connection terminal (26A) substantially equal to the potential of the second connection terminal (26B), and further reducing the degradation of the characteristics.

A radio frequency module (1b) according to a third aspect includes a mounting substrate (4), a first signal terminal (11), a second signal terminal (12), a ground terminal (18), and a hybrid filter (2b). The mounting substrate (4) has a first main surface (41) and a second main surface (42) opposed to each other. The first signal terminal (11), the second signal terminal (12), and the ground terminal (18) are disposed on the mounting substrate (4). The hybrid filter (2b) includes an acoustic wave filter (20b) and a first circuit (2CC). The acoustic wave filter (20b) includes at least one acoustic wave resonator (24), a first input/output portion (25b), and a second input/output portion (26b). The first circuit (2CC) includes a plurality of circuit elements (22) and is connected to the first input/output portion (25b) of the acoustic wave filter (20b). The plurality of circuit elements (22) include a plurality of inductors (L10, L11, L12) and a plurality of capacitors (C11, C12). The hybrid filter (2b) has a larger pass band width than the acoustic wave resonator (24). The first input/output portion (25b) of the acoustic wave filter (20b) includes a first connection terminal (25A), a second connection terminal (25B), and a conductor portion (253). The first connection terminal (25A) is connected to the mounting substrate (4). The second connection terminal (25B) is located apart from the first connection terminal (25A) in plan view in a thickness direction (D1) of the mounting substrate (4) and is connected to the mounting substrate (4). The conductor portion (253) connects the first connection terminal (25A) and the second connection terminal (25B). The first circuit (2CC) includes a second circuit (2AA) and a third circuit (2BB). The second circuit (2AA) is connected between the first connection terminal (25A) and the ground terminal (18). The second circuit (2AA) includes one circuit element (inductor L10) connected to the ground terminal (18) among the plurality of inductors (L10, L11, L12) and the plurality of capacitors (C11, C12). The third circuit (2BB) is connected between the second connection terminal (25B) and the first signal terminal (11). The third circuit (2BB) includes at least one inductor (L11, L12) among the plurality of inductors (L10, L11, L12) and at least one capacitor (C11, C12) among the plurality of capacitors (C11, C12).

The radio frequency module (1b) according to the third aspect is capable of reducing the degradation of the characteristics.

In a radio frequency module (1b) according to a fourth aspect, in the third aspect, the first connection terminal (25A) and the second connection terminal (25B) are adjacent to each other in plan view in the thickness direction (D1) of the mounting substrate (4).

The radio frequency module (1b) according to the fourth aspect is capable of making the potential of the first connection terminal (25A) substantially equal to the potential of the second connection terminal (25B), and further reducing the degradation of the characteristics.

In a radio frequency module (1; 1a) according to a fifth aspect, in the first or second aspect, the third circuit (2B) includes, among the plurality of inductors (L1, L2), an inductor (L1, L2) connected to the acoustic wave filter (20) without any of the plurality of capacitors (C0, C1, C2) interposed therebetween.

The radio frequency module (1; 1a) according to the fifth aspect is capable of further reducing the degradation of the characteristics.

In a radio frequency module (1; 1a) according to a sixth aspect, in any one of the first, second, and fifth aspects, in plan view in the thickness direction (D1) of the mounting substrate (4), the acoustic wave filter (20) overlaps, among the plurality of circuit elements (21), at least one circuit element (second capacitor C1) directly connected to the acoustic wave filter (20) in the third circuit (2B).

The radio frequency module (1; 1a) according to the sixth aspect is capable of further reducing the degradation of the characteristics.

In a radio frequency module (1; 1a) according to a seventh aspect, in any one of the first, second, and fifth aspects, on the first main surface (41) of the mounting substrate (4), the acoustic wave filter (20) is adjacent to, among the plurality of circuit elements (21), at least one circuit element (first inductor L1) directly connected to the acoustic wave filter (20) in the third circuit (2B).

The radio frequency module (1; 1a) according to the seventh aspect is capable of further reducing the degradation of the characteristics.

In a radio frequency module (1; 1a) according to an eighth aspect, in any one of the first, second, and fifth aspects, the third circuit (2B) includes a parallel circuit composed of one first inductor (L1) included in the plurality of inductors (L1, L2) and one capacitor (C1) included in the plurality of capacitors (C0, C1, C2).

In a radio frequency module (1; 1a; 1b) according to a ninth aspect, in any one of the first to eighth aspects, the radio frequency module further includes a third signal terminal (13) and a second filter (3). The third signal terminal (13) is disposed on the mounting substrate (4). The second filter (3) is connected between the first signal terminal (11) and the third signal terminal (13), the second filter (3) being different from a first filter (2; 2a; 2b) which is the hybrid filter (2; 2a; 2b).

The radio frequency module (1; 1a; 1b) according to the ninth aspect is capable of reducing the degradation of the characteristics of a multiplexer (100; 100a; 100b) including the hybrid filter (2; 2a; 2b).

In a radio frequency module (1; 1a; 1b) according to a tenth aspect, in the ninth aspect, the second filter (3) includes a second acoustic wave filter (30) including an acoustic wave resonator (34) different from the acoustic wave resonator (24) of a first acoustic wave filter (20) which is the acoustic wave filter (20). The first acoustic wave filter (20) includes a first substrate (substrate 1000). The second acoustic wave filter (30) includes a second substrate (substrate 1000). The first substrate (substrate 1000) and the second substrate (substrate 1000) are identical to each other.

In the radio frequency module (1; 1a; 1b) according to the tenth aspect, because the first substrate and the second substrate are identical to each other, it is possible to reduce the size of the radio frequency module (1; 1a; 1b) as compared with a case where the first substrate and the second substrate are different substrates. In the radio frequency module (1; 1a; 1b) according to the tenth aspect, because the first substrate and the second substrate are identical to each other, it is possible to increase the area of a heat dissipation path for the heat generated in each of the first acoustic wave filter (20) and the second acoustic wave filter (30), and it is possible to reduce an increase in the temperature of each of the first acoustic wave filter (20) and the second acoustic wave filter (30).

In a radio frequency module (1; 1a; 1b) according to an eleventh aspect, in the tenth aspect, the first acoustic wave filter (20) allows a transmission signal in a first communication band to pass therethrough, and the second acoustic wave filter (30) allows a transmission signal in a second communication band to pass therethrough.

In the radio frequency module (1; 1a; 1b) according to the eleventh aspect, the heat generated when a transmission signal in the first communication band passes through the first acoustic wave filter (20) is easily dissipated, and it is possible to improve the electric power handling capability of the acoustic wave resonator (24) of the first acoustic wave filter (20). In the radio frequency module (1; 1a; 1b) according to the eleventh aspect, the heat generated when a transmission signal in the second communication band passes through the second acoustic wave filter (30) is easily dissipated, and it is possible to improve the electric power handling capability of the acoustic wave resonator (34) of the second acoustic wave filter (30).

In a radio frequency module (1; 1a; 1b) according to a twelfth aspect, in any one of the ninth to eleventh aspects, in plan view in the thickness direction (D1) of the mounting substrate (4), the acoustic wave filter (20; 20b) is disposed closer to the plurality of circuit elements (21; 22) than the second filter (3).

The radio frequency module (1; 1a; 1b) according to the twelfth aspect is capable of, in the multiplexer (100; 100a; 100b) including the hybrid filter (2; 2a; 2b), reducing the degradation of the characteristics of the hybrid filter (2; 2a; 2b).

A communication device (300) according to a thirteenth aspect includes the radio frequency module (1; 1a; 1b) according to any one of the first to twelfth aspects, and a signal processing circuit (301). The signal processing circuit (301) performs signal processing on a radio frequency signal used in the radio frequency module (1; 1a; 1b).

The communication device (300) according to the thirteenth aspect is capable of reducing the degradation of the characteristics.

1, 1a, 1b radio frequency module
2, 2a, 2b hybrid filter (first filter)
2A second circuit
2B third circuit
2C first circuit
2AA second circuit
2BB third circuit
2CC first circuit
20, 20b acoustic wave filter (first acoustic wave filter)
21 circuit element
22 circuit element
24 acoustic wave resonator
241 first IDT electrode
25, 25b first input/output portion
25A first connection terminal
25B second connection terminal
253 conductor portion
26, 26b second input/output portion
26A first connection terminal
26B second connection terminal
263 conductor portion
250 path (series arm path)
251 path (parallel arm path)
252 path (parallel arm path)
3 second filter
30 second acoustic wave filter 35                                                                      36

34 acoustic wave resonator
341 second IDT electrode
35 first input/output portion
36 second input/output portion
37 ground electrode
350 path (series arm path)
351 path (parallel arm path)
352 path (parallel arm path)
353 path (parallel arm path)
354 path (parallel arm path)
355 path (parallel arm path)
4 mounting substrate
41 first main surface
42 second main surface
5 resin layer
51 main surface
53 outer peripheral surface
6 metal electrode layer
61 first conductor portion
62 second conductor portion
7 external connection terminal
8 first switch
80 common terminal
81 selection terminal
82 selection terminal
9 second switch
90 common terminal
91 selection terminal
92 selection terminal
10 electronic component
1000 substrate
1001 first main surface
1002 second main surface
11 first signal terminal
12 second signal terminal
13 third signal terminal
17 ground terminal
18 ground terminal
100, 100a, 100b multiplexer
111 first transmission filter
112 second transmission filter
121 first reception filter
122 second reception filter
131 first output matching circuit
132 second output matching circuit
141 first input matching circuit
142 second input matching circuit
151 first power amplifier
152 second power amplifier
161 first low-noise amplifier
162 second low-noise amplifier
200 radio frequency circuit
300 communication device
301 signal processing circuit
302 RF signal processing circuit
303 baseband signal processing circuit
309 antenna
C0 capacitor
C1 capacitor
C2 capacitor
C11 capacitor
C12 capacitor
D1 thickness direction
L1 inductor (first inductor)
L2 inductor (second inductor)
L10 inductor
L11 inductor L12 inductor
L13 inductor
L15 inductor
L25 inductor
La5 land
La51 land
La52 land
La6 land
La61 land
La62 land
La7 land
S21 series arm resonator
S31, S32, S33, S34, S35 series arm resonator
P21, P22 parallel arm resonator
P31, P32, P33, P34, P35 parallel arm resonator
T0 antenna terminal
T1 first signal input terminal
T2 second signal input terminal
T3 first signal output terminal
T4 second signal output terminal

The invention claimed is:

1. A radio frequency module comprising:
a mounting substrate having a first main surface and a second main surface opposed to each other;
a first signal terminal, a second signal terminal, and a ground terminal that are on the mounting substrate; and
a hybrid filter,
wherein the hybrid filter comprises:
an acoustic wave filter comprising at least one acoustic wave resonator, a first input/output portion connected to the first signal terminal, and a second input/output portion connected to the second signal terminal; and
a first circuit comprising a plurality of circuit elements, and connected to the second input/output portion of the acoustic wave filter,
wherein the plurality of circuit elements comprises:
a plurality of inductors; and
a plurality of capacitors,
wherein the hybrid filter has a wider pass band than the acoustic wave resonator,
wherein the second input/output portion of the acoustic wave filter comprises:
a first connection terminal connected to the mounting substrate;
a second connection terminal located apart from the first connection terminal in a plan view in a thickness direction of the mounting substrate, and connected to the mounting substrate; and
a conductor portion connecting the first connection terminal and the second connection terminal, and
wherein the first circuit comprises:
a second circuit connected between the first connection terminal and the ground terminal, and comprising at least a first one of the plurality of inductors or a first one of the plurality of capacitors; and
a third circuit connected between the second connection terminal and the second signal terminal, and comprising at least a second one of the plurality of inductors and at least a second one of the plurality of capacitors.

2. The radio frequency module according to claim 1, further comprising:
a third signal terminal on the mounting substrate; and
a second filter connected between the first signal terminal and the third signal terminal, the second filter being different from the hybrid filter.

3. The radio frequency module according to claim 2, wherein the second filter comprises a second acoustic wave filter comprising a second acoustic wave resonator different from the acoustic wave resonator of the acoustic wave filter, wherein the first acoustic wave filter comprises a first substrate, wherein the second acoustic wave filter comprises a second substrate, and wherein the first substrate and the second substrate are identical to each other.

4. The radio frequency module according to claim 3, wherein the first acoustic wave filter is configured to pass a transmission signal in a first communication band, and wherein the second acoustic wave filter is configured to pass a transmission signal in a second communication band.

5. The radio frequency module according to claim 2, wherein in the plan view, the acoustic wave filter is closer to the plurality of circuit elements than the second filter.

6. The radio frequency module according to claim 1, wherein the first connection terminal and the second connection terminal are adjacent to each other in the plan view.

7. The radio frequency module according to claim 1, wherein the second one of the plurality of inductors is connected to the acoustic wave filter without any of the plurality of capacitors interposed therebetween.

8. The radio frequency module according to claim 1, wherein in the plan view, the acoustic wave filter overlaps at least one of the plurality of circuit elements that is directly connected to the acoustic wave filter in the third circuit.

9. The radio frequency module according to claim 1, wherein on the first main surface of the mounting substrate, the acoustic wave filter is adjacent to at least one of the plurality of circuit elements that is directly connected to the acoustic wave filter in the third circuit.

10. The radio frequency module according to claim 1, wherein the third circuit comprises a parallel circuit comprising the second one of the plurality of inductors and the second one of the plurality of capacitors.

11. A communication device comprising:

the radio frequency module according to claim 1; and a signal processing circuit configured to perform signal processing on a radio frequency signal passing through the radio frequency module.

12. A radio frequency module comprising:

a mounting substrate having a first main surface and a second main surface opposed to each other;

a first signal terminal, a second signal terminal, and a ground terminal that are on the mounting substrate; and a hybrid filter, wherein the hybrid filter comprises:

an acoustic wave filter comprising at least one acoustic wave resonator, a first input/output portion connected to the first signal terminal, and a second input/output portion connected to the second signal terminal; and a first circuit comprising a plurality of circuit elements, and connected to the first input/output portion of the acoustic wave filter, wherein the plurality of circuit elements comprises:

a plurality of inductors; and a plurality of capacitors, wherein the hybrid filter has a wider pass band than the acoustic wave resonator, wherein the first input/output portion of the acoustic wave filter comprises:

a first connection terminal connected to the mounting substrate;

a second connection terminal located apart from the first connection terminal in a plan view in a thickness direction of the mounting substrate and connected to the mounting substrate; and a conductor portion connecting the first connection terminal and the second connection terminal, and wherein the first circuit comprises:

a second circuit connected between the first connection terminal and the ground terminal, and comprising at least a first one of the plurality of inductors or a first one of the plurality of capacitors, and a third circuit connected between the second connection terminal and the first signal terminal, and comprising at least a second one of the plurality of inductors and at least a second one of the plurality of capacitors.

13. The radio frequency module according to claim 12, further comprising:

a third signal terminal on the mounting substrate; and a second filter connected between the first signal terminal and the third signal terminal, the second filter being different from the hybrid filter.

14. The radio frequency module according to claim 13, wherein the second filter comprises a second acoustic wave filter comprising a second acoustic wave resonator different from the acoustic wave resonator of the acoustic wave filter, wherein the first acoustic wave filter comprises a first substrate, wherein the second acoustic wave filter comprises a second substrate, and wherein the first substrate and the second substrate are identical to each other.

15. The radio frequency module according to claim 14, wherein the first acoustic wave filter is configured to pass a transmission signal in a first communication band, and wherein the second acoustic wave filter is configured to pass a transmission signal in a second communication band.

16. The radio frequency module according to claim 13, wherein in the plan view, the acoustic wave filter is closer to the plurality of circuit elements than the second filter.

17. The radio frequency module according to claim 12, wherein the first connection terminal and the second connection terminal are adjacent to each other in the plan view.

18. A communication device comprising:

the radio frequency module according to claim 12; and a signal processing circuit configured to perform signal processing on a radio frequency signal passing through the radio frequency module.

\* \* \* \* \*